US012415341B2

(12) United States Patent
Boyd et al.

(10) Patent No.: US 12,415,341 B2
(45) Date of Patent: *Sep. 16, 2025

(54) SYSTEMS AND METHODS FOR IMPLEMENTING SELECTIVE ELECTROMAGNETIC ENERGY FILTERING OBJECTS AND COATINGS USING SELECTABLY TRANSMISSIVE ENERGY SCATTERING LAYERS

(71) Applicant: FACE INTERNATIONAL CORPORATION, Norfolk, VA (US)

(72) Inventors: Clark D. Boyd, Portsmouth, VA (US); Bradbury R Face, Smithfield, VA (US); Jeffrey D Shepard, Norco, CA (US)

(73) Assignee: FACE INTERNATIONAL CORPORATON, Norfolk, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/839,437

(22) Filed: Jun. 13, 2022

(65) Prior Publication Data
US 2022/0305759 A1    Sep. 29, 2022

Related U.S. Application Data

(63) Continuation of application No. 16/505,684, filed on Jul. 8, 2019, now Pat. No. 11,358,370, which is a
(Continued)

(51) Int. Cl.
*B32B 17/00* (2006.01)
*B32B 7/02* (2019.01)
(Continued)

(52) U.S. Cl.
CPC ................ *B32B 17/00* (2013.01); *B32B 7/02* (2013.01); *B32B 27/06* (2013.01); *G01J 1/0488* (2013.01);
(Continued)

(58) Field of Classification Search
CPC ........... B32B 17/00; B32B 7/02; B32B 27/06; B32B 2255/00; B32B 2255/20;
(Continued)

(56) References Cited

U.S. PATENT DOCUMENTS 4,967,956 A    11/1990  Mansfield et al.
5,877,874 A    3/1999   Rosenberg
(Continued)

OTHER PUBLICATIONS

International Search Report for PCT/US2016/027393 dated Jul. 29, 2016.
Written Opinion for PCT/US2016/027393 dated Jul. 29, 2016.

*Primary Examiner* — Tuyen Tra
(74) *Attorney, Agent, or Firm* — Lowndes; Stephen C. Thomas; Robert R. Fredeking

(57) ABSTRACT

A system and method are provided for forming energy filter layers or shutter components, including energy scattering layers that are actively electrically switchable. The energy filters or shutter components are operable between at least a first mode in which the layers, and thus the presentation of the shutter components, appear substantially transparent when viewed from an energy/light incident side, and a second mode in which the layers, and thus the presentation of the energy filters or shutter components, appear opaque to the incident energy impinging on the energy incident side. The differing modes are selectable by electrically energizing, differentially energizing and/or de-energizing electric fields in a vicinity of the energy scattering layers. Refractive indices of transparent particles, and the transparent matrices in which the particles are fixed, are tunable according to the applied electric fields. The energy scattering layers may conceal a sensor such as a camera or photovoltaic cell.

8 Claims, 11 Drawing Sheets

Related U.S. Application Data continuation of application No. 15/671,087, filed on Aug. 7, 2017, now Pat. No. 10,345,491, which is a continuation of application No. 15/006,148, filed on Jan. 26, 2016, now Pat. No. 9,726,790.

(60) Provisional application No. 62/147,573, filed on Apr. 14, 2015.

(51) Int. Cl.
| | |
|---|---|
| *B32B 27/06* | (2006.01) |
| *G01J 1/04* | (2006.01) |
| *G02B 1/10* | (2015.01) |
| *G02B 5/02* | (2006.01) |
| *G02B 5/20* | (2006.01) |
| *G02B 27/10* | (2006.01) |
| *G02F 1/00* | (2006.01) |
| *G02F 1/01* | (2006.01) |
| *G02F 1/19* | (2019.01) |
| *G06F 1/16* | (2006.01) |
| *H02S 40/00* | (2014.01) |
| *H10F 77/30* | (2025.01) |
| *H10F 77/40* | (2025.01) |
| *G01J 3/12* | (2006.01) |
| *G02B 5/26* | (2006.01) |

(52) U.S. Cl.
CPC ............ *G02B 1/10* (2013.01); *G02B 5/0242* (2013.01); *G02B 5/0263* (2013.01); *G02B 5/0268* (2013.01); *G02B 5/0284* (2013.01); *G02B 5/0289* (2013.01); *G02B 5/201* (2013.01); *G02B 5/206* (2013.01); *G02B 27/1006* (2013.01); *G02F 1/0018* (2013.01); *G02F 1/01* (2013.01); *G02F 1/0102* (2013.01); *G02F 1/0121* (2013.01); *G02F 1/19* (2013.01); *G06F 1/16* (2013.01); *H02S 40/00* (2013.01); *H10F 77/306* (2025.01); *H10F 77/315* (2025.01); *H10F 77/413* (2025.01); *B32B 2255/00* (2013.01); *B32B 2255/20* (2013.01); *B32B 2255/26* (2013.01); *B32B 2255/28* (2013.01); *B32B 2307/404* (2013.01); *B32B 2307/41* (2013.01); *B32B 2307/412* (2013.01); *B32B 2307/418* (2013.01); *B32B 2457/12* (2013.01); *B32B 2559/00* (2013.01); *G01J 2003/1213* (2013.01); *G02B 5/26* (2013.01); *Y02E 10/52* (2013.01)

(58) Field of Classification Search
CPC ............ B32B 2255/26; B32B 2255/28; B32B 2307/404; B32B 2307/41; B32B 2307/412; B32B 2307/418; B32B 2457/12; B32B 2559/00; G01J 1/0488; G01J 2003/1213; G02B 1/10; G02B 5/0242; G02B 5/0263; G02B 5/0268; G02B 5/0284; G02B 5/0289; G02B 5/201; G02B 5/206; G02B 27/1006; G02B 5/26; G02B 2207/123; G02B 5/0247; G02F 1/0018; G02F 1/01; G02F 1/0102; G02F 1/0121; G02F 1/19; G02F 1/13; G02F 1/1675; G02F 1/1676; G02F 1/1685; G06F 1/16; H01L 31/02161; H01L 31/02168; H01L 31/02327; H02S 40/00; Y02E 10/52; B60J 3/04; E06B 9/24

USPC ........................ 359/237, 238, 240, 245, 263

See application file for complete search history.

(56) References Cited

U.S. PATENT DOCUMENTS

| | | | |
|---|---|---|---|
| 7,990,605 B2 * | 8/2011 | Okuyama | ......... G02F 1/133615 345/87 |
| 8,669,325 B1 | 3/2014 | Hyman | |
| 8,963,404 B2 | 2/2015 | Lee et al. | |
| 9,118,000 B2 | 8/2015 | Kang et al. | |
| 9,193,580 B1 | 11/2015 | Sodano et al. | |
| 9,419,544 B2 | 8/2016 | Kim et al. | |
| 9,444,031 B2 | 9/2016 | Park et al. | |
| 9,568,799 B2 | 2/2017 | Lam et al. | |
| 11,358,370 B2 * | 6/2022 | Boyd | ......... G02F 1/01 |
| 2005/0019712 A1 | 1/2005 | Ikeda et al. | |
| 2009/0269579 A1 | 10/2009 | Minaki | |
| 2010/0278561 A1 | 11/2010 | Kanda et al. | |
| 2011/0278434 A1 | 11/2011 | Chau et al. | |
| 2014/0185282 A1 | 7/2014 | Hsu et al. | |
| 2014/0254017 A1 | 9/2014 | Manoharan et al. | |
| 2015/0145376 A1 | 5/2015 | Sun et al. | |
| 2015/0194911 A1 | 7/2015 | Kim et al. | |
| 2016/0134204 A1 | 5/2016 | Al Ahmad et al. | |
| 2016/0149517 A1 | 5/2016 | Choi et al. | |
| 2016/0294305 A1 | 10/2016 | Kim et al. | |
| 2017/0019034 A1 | 1/2017 | Fujita et al. | |

* cited by examiner

SYSTEMS AND METHODS FOR IMPLEMENTING SELECTIVE ELECTROMAGNETIC ENERGY FILTERING OBJECTS AND COATINGS USING SELECTABLY TRANSMISSIVE ENERGY SCATTERING LAYERS

RELATED APPLICATIONS

This non-provisional application for patent is a continuation of U.S. patent application Ser. No. 16/505,684, entitled "SYSTEMS AND METHODS FOR IMPLEMENTING SELECTIVE ELECTROMAGNETIC ENERGY FILTERING OBJECTS AND COATINGS USING SELECTABLY TRANSMISSIVE ENERGY SCATTERING LAYERS", which published as U.S. Application Publication No. US 2019-0331835 A1 on Oct. 31, 2019, and which issued as U.S. Pat. No. 11,358,370 on Jun. 14, 2022, the disclosure of which is incorporated herein by reference in its entirety; 16/505,684 is a continuation of U.S. patent application Ser. No. 15/671,087, filed in the United States Patent and Trademark Office (USPTO) on Aug. 7, 2017, entitled "SYSTEMS AND METHODS FOR IMPLEMENTING SELECTIVE ELECTROMAGNETIC ENERGY FILTERING OBJECTS AND COATINGS USING SELECTABLY TRANSMISSIVE ENERGY SCATTERING LAYERS", which published as U.S. Patent Application No. US 2017-0336540 A1 on Nov. 23, 2017, and which issued from the USPTO on Jul. 9, 2019 as U.S. Pat. No. 10,345,491, the disclosure of which is incorporated by reference herein in its entirety; Ser. No. 15/671,087 is a continuation of U.S. patent application Ser. No. 15/006,148, filed in the USPTO on Jan. 26, 2016, which published as U.S. Patent Application No. US 2016-0306254 A1 on Oct. 20, 2016, and which issued as U.S. Pat. No. 9,726,790 on Aug. 8, 2017, the disclosure of which is incorporated herein by reference in its entirety; Ser. No. 15/006,148 claims the benefit of U.S. Provisional Patent Application No. 62/147,573 entitled "Photovoltaic Cell and/ or Photocell With Light Scattering Layer" by Clark D. BOYD et al., filed in the USPTO on Apr. 14, 2015, the disclosures of all of the foregoing patent applications and issued patents are hereby incorporated by reference herein in their entirety. This application is related to U.S. patent application Ser. No. 15/006,143, entitled "Systems and Methods for Producing Laminates, Laminate Layers and Coatings Including Elements for Scattering and Passing Selective Wavelengths of Electromagnetic Energy," filed on Jan. 26 2016, and which published as U.S. Patent Application Publication No. 2016/0306078 A1 on Oct. 20, 2016; U.S. patent application Ser. No. 15/006,145, entitled "Systems and Methods for Producing Objects Incorporating Selective Electromagnetic Energy Scattering Layers, Laminates and Coatings", filed in the USPTO on Jan. 26, 2016, which published as U.S. Patent Application Publication No. 2016/0306080 A1 on Oct. 20, 2016 and which issued as U.S. Pat. No. 10,795,062 on Oct. 6, 2020; and U.S. patent application Ser. No. 15/006,150, entitled "Systems and Methods for Producing Objects Incorporating Selectably Active Electromagnetic Energy Filtering Layers and Coatings," filed on Jan. 26, 2016, which published as U.S. Patent Publication No. US 2016-0306255 A1 on Oct. 20, 2016 and which issued as U.S. Pat. No. 9,726,791 on Aug. 8, 2017, the disclosures of all of the foregoing patent applications and issued patents are hereby incorporated by reference herein in their entirety.

BACKGROUND

1. Field of the Disclosed Embodiments

This disclosure relates to systems and methods for forming electrically-activated filter layers and shutter components including energy/light directing or scattering layers that are actively electrically switchable between a first mode in which the layers, and thus the presentation of the shutter component, appear substantially transparent (or translucent) to impinging energy when viewed from an energy/light incident side and a second mode in which the layers, and thus the presentation of the shutter component, appear opaque to the impinging energy when viewed from the energy/light incident side, by uniquely implementing energy/light directing/scattering techniques in energy/light transmissive layers, and to objects, object portions, wall plates, lenses, filters, screens and the like that are formed of, or that otherwise incorporate, such electrically-activated layers and/or shutter components.

2. Related Art

An ability to provide or promote selectable transmission of electromagnetic energy, including light in the visual or near-visual radiofrequency (RF) spectrum through layers, materials, screens, structures or structural components provide substantial benefit in a number of real-world use cases and applications.

In the Background Section of the related 143 and 145 applications identified above, certain of these real-world use cases and applications are discussed in detail. The different uses of windows, skylights and the like, whether left transparent, or otherwise frosted, tinted or treated in some manner, in allowing the interiors of structures to be "naturally" sunlit are examples. Modification of the transparent lighting capability of a particular window is useful to address certain concerns including privacy and security, and to provide certain selected aesthetics (in the use of, for example, stained-glass windows). It is recognized that clear (transparent) windows may be usable in some scenarios, while surface, or internally, treated windows may be usable in other scenarios. In generally all techniques employed to modify the energy/light transmissive properties of a particular window, or window pane, whether formed of glass or other transparent material, it is recognized that light passing through those windows, in either direction, is generally affected by whatever treatment is applied on, or in, the individual glass or other material windows or window panes substantially equally in both directions.

Window treatments are also provided that result in a substantially one-way mirror (also referred to in some instances as a two-way mirror). The one-way mirror panels are particularly formed to be partially reflective, and partially transparent, by tuning the optical properties of the panels to produce an optical "trick" based on differential lighting between opposing surfaces of the mirror. It is noted that the intensity of the light has to be differential between the two sides of the one-way mirror because, in actuality, the light energy always passes through the mirror again substantially equally in both directions. Thus, the principle of operation is to keep one side brightly lit rendering that side "difficult" to see through based on the principle that the reflected light masks visual penetration of the mirror from the brightly lit side. The very effect that is intended, in that a substantial portion of the incident light be reflected back from the "lighted" side of the mirror, provides a substantially non-modifiable adverse transmissive property of the ambient light on the lighted side of the panel through the panel. High-end vehicle window tinting accomplishes essentially the same effect in adding an inner or outer reflective layer. The configuration of the substantially darkened tinting is known to adversely affect a light transmissive property, for example, when observed from an outside of the vehicle to an inside of the vehicle, which is necessarily darkened or shaded in a non-discriminant manner.

Recently, advertising schemes have emerged in which what is commercially described as a "View Through Vinyl" is applied to windows to provide what, at first observation, appears to be opaque signage, often in the form of a particular advertisement, formed on office windows, on a bus windows, or on other like glass surface that is selected for ease of application, and removal as necessary of the vinyl application. The vinyl application can be effectively "viewed-through" from the non-image side based on the applied vinyl film (generally having a printed image side and an adhesive-bearing non-image side) being perforated with pinholes that may be preferably in a range of 1.5 mm in diameter typically in a 65/35 pattern in which 35% of the graphics on the printed side are removed to produce a fine mesh window covering. Such a perforation scheme leaves enough printed design on the observation side that the signage "appears" opaque, while removing enough of the vinyl material from the film to provide see-through visibility from the non-printed or non-image side. These schemes are further limited by necessarily requiring that particular dimensions of a window area to be covered are known, and the window area must be available for the view-through vinyl to be applied thereto.

Separately, there are certain manufactured fabrics that appear to be opaque to observation, but that allow for the transmission of particular wavelengths of electromagnetic energy, including visible light rays, or near-visible light rays. Descriptions of such material and their uses are found in, for example, U.S. Pat. No. 5,518,798 to Riedel (Issued May 21, 1996) describing a composition of a particular material that transmits sunlight, and to the swimwear and light-protective wear made from the material, and in U.K. Patent Application Publication No. 2 461 488 to Lanham-New (Published Mar. 8, 2011) directed to articles of headwear formed of a material that appears substantially opaque as observed, but the transmits sunlight in an effort to reduce, for example, a vitamin D deficiency in the wearer.

Remote sensors for discerning all manner of environmental factors and/or activities in a particularly-monitored area through the collection and analysis of electromagnetic energy elements present in the particularly-monitored area continue to gain broader proliferation and acceptance as new and unique employment scenarios emerge. In the fields of area observation, surveillance and monitoring, still and video cameras, and all manner of visual light, and near-visual light, reactive sensors are often employed. Depending on the nature of the area observation, surveillance or monitoring, it may be preferable to conceal or camouflage the presence of a particular camera or other electromagnetic energy sensor in order that a presence of the camera or other sensor goes largely undetected to casual observers or intruders in the monitored areas. Other considerations include that it may simply be preferable to unobtrusively embed the cameras or sensors in a particular structure in a manner that does not adversely affect the aesthetics of the structure. A difficulty is that conventional attempts to conceal, camouflage or otherwise hide the lenses of the cameras, or the image or other energy receivers of the sensors, generally indiscriminately and/or disadvantageously modify the characteristics of the visual, or near-visual, light passing through the concealment to the cameras or sensors devices, this modification of the characteristics of the energy passing through the layer can, and generally does, adversely affect their operation in a concealed operational employment scenario.

In the field of energy collection, and energy harvesting, photovoltaic cells, or other photocells, are often advantageously employed on or in a particular structure to convert ambient light to electricity. The efficiency of a particular photocell is affected by its capacity to absorb, and/or to minimize reflectance of, incident light upon the surface of the photocell. For this reason, photocells are generally formed to have dark, normally black or dark grey, exposed light-facing or light-incident ("facial") surfaces. Maximum efficiency is achieved when the dark facial surface is exposed to unfiltered light in the visible, or near-visible, spectrum. It is for this reason that, in virtually all conventional installations, the photocells are mounted unmodified on an external surface of a structure either (1) fully exposed, or (2) exposed behind a clear glass, clear plastic or similar clear (transparent) protective outer structural layer that transmits the visual, or near-visual light, in a month modified matter, to the facial surfaces of the photocells. A significant drawback to the wider proliferation of photocells used in a number of potentially beneficial operating or employment scenarios is that such "required" installations, in many instances, adversely affects the aesthetics of the structure or object on which the photocells are to be mounted for use. Presence of photocells in a particular installation is, therefore, easily visually distinguishable. For this reason alone, inclusion of photocells in particular installations, or in association with certain structures, objects or products is often avoided. Manufacturers generally make these decisions based on the photocells, when installed, becoming visual detractors or distractors to the appearance or ornamental design of the structures, objects or products on which photocells may be otherwise advantageously applied and employed.

The last several decades have seen an explosion in the proliferation of electronic visual display components of every shape and size to provide information display, enhanced entertainment, changeable signage and the like. As technology has advanced, particularly in an in-home or in-office operating environment, much effort has been put toward attempting to render display components, even as they become more ubiquitous, less obtrusive. Television and other in-home entertainment display components, as an example, even as bulky CRT display units have been substantially replaced by flat screen display units, are often "hidden" in cabinets, or sometimes camouflaged behind smoke-glass facades.

SUMMARY

The above discussion provides a non-limiting list of examples of a number of real-world use cases in which differing technologies for providing surface treatments and coverings that, in particular circumstances, effectively "trick" the human eye into seeing a particular presentation from a viewing, observation or light incident side while providing some graduated level of filtered transmission of visual light, or near-visual light, through the surface treatments and coverings in a manner that allows certain, but not all, of the RF energy to penetrate the surface treatments and coverings. Although the above discussion is centered on visual optics, the principles according to this disclosure may be equally applicable to filtering of wavelengths electromagnetic energy lying outside the visual spectrum. To date, however, the particular implementations discussed above, and other like implementations, are all constrained in their ability to be more-broadly adapted to a far greater range of use cases based on their inherent limitations, the particular manufacturing processes by which objects including these particularized capabilities are formed, and certain attendant drawbacks in their use, particularly with regard to the manner in which the electromagnetic energy, including light in the visible and near-visible spectrum is limited, filtered, occluded or otherwise modified as it passes from an energy- or light-incident side to an opposite side of the particular structure, structural component structural outer layer.

In view of the above-identified limitations with regard to the applications of known aesthetics and similar energy and/or lighting control applications, particularly in implementation of selective energy transmissive schemes, techniques and/or materials, it would be advantageous to develop an advanced switchable facade or coating that would, according to an active selection, be switchable between a substantially transparent mode and a mode in which at least an energy-or light-incident side appears opaque to selectable impinging wavelengths of electromagnetic energy.

It would be further advantageous to format a perceptible color, texture, image presentation of an apparent opaque light-incident side in a manner that would be adaptable to blend aesthetically with the presentation of a surrounding structure.

Exemplary embodiments and systems and methods according to this disclosure may provide an electrically-switchable energy-filtering and/or shutter component with at least two separately-selectable operating modes. In embodiments, in a first operating mode, the electrically-switchable energy-filtering and/or shutter component may be configured to be substantially transparent to electromagnetic energy or light passing through the component in either direction. In embodiments, in a second operating mode, the electrically-switchable energy-filtering and/or shutter component may be configured to appear opaque from an outer, viewing, observation or energy/light-incident side, and to otherwise provide a substantially unfiltered energy/light transmissive property rendering the energy-filtering and/or shutter component substantially energy and/or light transparent, as viewed from an opposite or non-energy/light-incident side.

Exemplary embodiments may provide techniques, processes and schemes by which to form, or otherwise incorporate, one or more electrically-switchable energy-scattering layers or shutter components into objects, object portions, wall plates, structural layers, lenses, filters, screens or the like in one or more of solid objects and/or manufactured systems or components of systems that are formed or manufactured to myriad beneficial purposes.

Exemplary embodiments may form individual laminates, coatings, films or structures in which an appearance is altered by varying an electric potential applied across the laminates, coatings, films or structures, including by modifying an electric potential applied to electrodes in the laminates, coatings, films or structures, all of which are examples of the disclosed electrically-switchable filtering or shutter components. In embodiment, an objective of such switchable layers or components may be to allow the appearance of the area behind the laminate, coating, film or structure to be masked by a wide range of chosen colors, textures and/or designs, while enhancing an appearance of an area where the laminates, coatings, films or structures are applied, positioned or placed, and allowing the transmission of substantially all wavelengths of electromagnetic energy, including energy in the visible light or near-visible light spectrum, into the area behind the laminate, coating, film or structure.

Exemplary embodiments may provide a means by which to switchably adjust a visual appearance of a surface and to allow light to pass through the surface to an area behind the surface. In embodiments, the particular structure of an energy/light scattering layer may be provided that allows the visual appearance of a covered area, implement, display or structure to be masked, such that the covered area, implement, display or structure may appear to an observer on an energy/light incident side of the energy/light scattering layer to appear as a predetermined color, color pattern, texture or image.

In embodiments, an electrically-switchable energy/light directing layer may be provided that, in use, covers an area of interest. The energy/light directing layer may scatter at least a portion of the impinging energy/light spectrum back to an observer, so that a covered area may give the appearance of having a particular color, color pattern, texture or image. The portion of the energy/light spectrum scattered back to the observer may be adjustable by an application of an electric potential through the energy/light directing layer, including by applying a voltage to substantially transparent electrodes located proximal to the laminate, coating, film or structure incorporating such an energy/light directing layer.

In embodiments, a laminate, coating film, or structure may include an operative layer (alternatively referred to as a light directing layer, a light scattering layer or a light transmissive layer) that is formed of micrometer or sub-micrometer particles (which may be in the form of spheres), including micro-particles and nano-particles, and interstitial voids, including micro/nano voids (as produced by microspheres or an evaporation process), or a combination of particles, micro-particles, nano-particles, and/or micro/nano voids, depending on a color, texture image desired and certain other implementing technical factors. In embodiments, the micrometer or subject-micrometer particles may be in a range of 25 microns or less in diameter and may be comprised of an electro-optical material with an index of refraction that is capable of changing values according to an electric field being sensed, applied, changed or removed.

In embodiments, disclosed energy filtering and/or shutter components may be incorporated into various structures and/or products, allowing for the inclusion of myriad embedded displays, sensor components, imaging devices, photoelectric generators/photocells and the like, without detracting from the visual appearance, or aesthetic nature, of the structures or products.

In embodiments, an actively electrically-switchable energy filtering or shutter component including an energy/light directing layer may be employed to completely mask portions of a structure or product, up to and including over an entire (100% coverage) of a surface area of the structure or product, in order that any embedded components may not be visually discernible when observed from an energy/light-incident side and may go completely unnoticed by an observer observing the structure or product from the energy/light-incident side.

In embodiments, the energy/light directing layer may be switchable between a masking mode and a substantially transparent mode.

In embodiments, energy/light transmission may be accomplished on a wide variety of surfaces, while being completely masked or camouflaged. As a non-limiting example, a roof of a residential home may be provided with switchable skylights that, in one operating mode, maintain an appearance of a typical shingled roof, i.e., in an opaque presentation that substantially matches the color and texture of the surroundings shingles. Separately, a portion of a wall may be configured to include energy/light transmitting panels, while having an appearance of a painted surface, textured surface, or even imaged as artwork.

In particular embodiments, an amount of energy/light transmission may be adjusted. In the same or other embodiments, color may also be adjusted when a material system incorporating the disclosed electrically-switchable energy filtering or shutter component is designed for such a light-changing, or appearance-changing function.

In embodiments, because the energy/light transmissive layers are comprised of substantially-transparent components, there is virtually no restriction on a particular environment, or to a particular use, in which the electrically-switchable energy-filtering or shutter components including such layers, and/or objects formed of, or with, such energy-filtering or shutter components, may be operatively deployed for use.

In embodiments, the micrometer or sub-micrometer particles (or spheres), including micro-particles and/or nano-particles, may be comprised of, for example, barium titanate ($BaTiO_4$) and strontium titanate ($SrTiO_4$) in order to take advantage of an adjustably high index of refraction.

In embodiments, refractive indices of all or portions of disclosed energy directing or energy scattering layers may be particularly tuned according to sizes of the micrometer and sub-micrometer spheres, compositions of materials from which the micrometer and sub-micrometer spheres may be formed (including in a layered manner), compositions of materials forming matrices in which the micrometer and sub-micrometer spheres are dispersed and fixed, and sizes of interstitial spaces (voids) provided between micrometer and sub-micrometer spheres in or through the matrix materials.

Exemplary embodiments may provide electrically-switchable energy filtering or shutter components comprising energy/light scattering layers as constituent components thereof, that may be incorporated into solid object body structures, hollow object body structures or otherwise as object outer layers in which the energy/light scattering layers allow wavelengths of incident energy/light to pass through the energy/light scattering layers, while scattering determined wavelengths of the incident energy/light to produce a desired visual appearance in the energy/light scattering layer when viewed from a viewing, observation or energy/light-incident side in a shutter-active (non-energy-filtering) or shutter-closed (energy-filtering) mode of operation.

In embodiments, the energy/light scattering layers incorporated into the energy filtering or shutter components may be formed, or electrically-manipulated, in a manner that scatters a same wavelength of light across an entirety of the particular energy/light scattering layer whether included for full coverage of an outer surface of an object or only at discrete portions of an outer surface of an object. In such embodiments, sphere or particle sizes, and material compositions of the spheres or particles, and the matrix within which the spheres or particles are fixed, may be substantially homogenous across an expanse of the energy/light scattering layers and subject to activation by a non-varying electric field.

In embodiments, the energy/light scattering layers incorporated into the energy filtering or shutter components may be formed, or electrically-manipulated, in a manner that scatters determined wavelengths of the incident energy/light within discrete areas of the energy/light scattering layer in order that, rather than reflecting/scattering a single color, the energy/light scattering layer may reflect/scatter multiple colors, and even patterned, texturized, and/or multi-color images. In such embodiments, differing refractive indices are presented across an expanse of the energy/light scattering layer by varying sphere or particle sizes, and/or material compositions of the spheres and/or particles and the matrix within which the spheres and/or particles are fixed. In other words, a composition of the light scattering layer will be substantially non-homogenous. In these embodiments, varying electric fields across an expanse of the energy/light scattering layers may also induce differing/multiple colors and/or textures in the surface presentations.

In embodiments, the energy/light scattering layers incorporated into the energy filtering or shutter components may be formed using substantially-transparent metal nanoparticles embedded in dielectric matrices.

Exemplary embodiments may form energy filtering or shutter components for inclusion in solid object body structures, or object outer layers, that may be used to facilitate transmissivity of light in one direction in order to promote lighting of an area shaded by structures otherwise formed of conventional materials. By way of non-limiting example, these normally-shaded areas may include the volume of area underlying an elevated porch, or other like normally disadvantageously shaded area.

Exemplary embodiments may form energy filtering or shutter components for inclusion in solid object body structures, or object outer layers, that may house or cover all manner of light-activated, light-absorbing, light-employing, or otherwise operationally light-involved sensors including, but not limited to, cameras, lights sensors, photovoltaic cells/photocells and the like.

Exemplary embodiments may provide objects formed of, or including as an outer layer, at least one electrically-switchable energy filtering or shutter component incorporating a surface energy/light scattering layer that allows, in cases, the visual appearance of embedded components, including electronic data or digital display components, to be masked behind an object surface that can appear to an observer to have a predetermined surface color or a predetermined surface color pattern, or to be comprised of a predetermined surface image, which is then switchable to be completely transparent and not obscure viewing of the electronic data or digital display component, when in use.

Exemplary embodiments may form wall plates of typical residential and/or commercial configuration as solid object body structures including active energy filtering or shutter components with selectable energy/light scattering layers for covering typical electrical switches, outlets and other residential and commercial installations. In embodiments, underlying switch boxes and/or outlet boxes may be configured to include energy- and/or light-activated sensors, devices, power generation components or the like. Provision of a wall plate according to the disclosed embodiments may facilitate energy transmission through the wall plate, having an opaque appearance, to the underlying sensors, devices or components. In embodiments, such sensors, devices or components maybe affixed to the box side (non-light-incident side) of the wall plates. In embodiments, there may be provided an energy crossover or interchange unit for applying a constant or variable electric field to activate energy/light scattering layer between selectable modes of operation.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for forming electrically-activated energy filter layers and/or shutter components including energy/light directing/scattering layers that are actively electrically switchable between a first mode in which the layers, and thus the presentation of the energy filters or shutter components, appear substantially transparent (or translucent) to impinging energy when viewed from an energy/light incident side and a second mode in which the layers, and thus the presentation of the energy filters or shutter components, appear opaque to the impinging energy when viewed from the energy/light incident side, by uniquely implementing energy/light directing/scattering techniques in the energy/light transmissive layers, and to objects, object portions, wall plates, lenses, filters, screens and the like that are formed of, or that otherwise incorporate, such electrically-activated energy filter layers and/or shutter components, will be described, in detail, with reference to the following drawings, in which.

DETAILED DESCRIPTION OF EMBODIMENTS

Figure 1A:
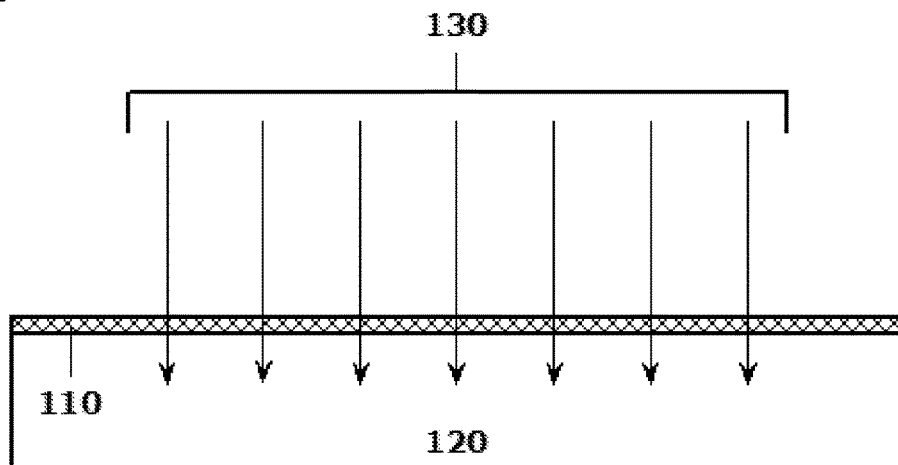
FIGS. 1A and 1B illustrate schematic diagrams of an exemplary physical body component including an electrically-switchable energy/light scattering layer disposed on a transparent portion of a 3D body structure operating in (1) a transparent first operating mode (see FIG. 1A), and (2) an opaque second operating mode (see FIG. 113) (depending on influence applied by an external electrical field), according to this disclosure.

The systems and methods according to this disclosure include techniques for forming electrically-activated filter layers and/or shutter components including energy/light directing/scattering layers that are actively electrically switchable between a first mode in which the layers, and thus the presentation of the energy filters or shutter components, appear substantially transparent (or translucent) to impinging energy when viewed from an energy/light incident side and a second mode in which the layers, and thus the presentation of the energy filters or shutter components, appear opaque when viewed from the energy/light incident side. The disclosed energy/light directing/scattering layers may be particularly formed to selectively scatter particular wavelengths of impinging electromagnetic energy, including light energy in the visual, near-visual or non-visual ranges, while allowing remaining wavelengths of the impinging energy to pass therethrough when operating in the second mode. These layers may uniquely employ energy/light directing/scattering techniques in the energy/light transmissive layers. The disclosed systems and methods may further include techniques for forming objects, object portions, wall plates, lenses, filters, screens and the like that may be entirely formed of, or that otherwise incorporate, such energy filter or shutter components. Descriptions of the disclosed systems and methods will refer to a range of real world use cases and applications for such electrically-switchable energy filter or shutter components.

Exemplary embodiments described and depicted in this disclosure should not be interpreted as being specifically limited to any particular configuration of a structure, object, object portion, article of manufacture or component section thereof, that may beneficially include such an energy filter or shutter component. The disclosed embodiments should also not be interpreted as being limited to any particular individual materials for forming the described light scattering, light directing or light transmissive layers, as active operating portions of the disclosed shutter components. This includes, but is not limited to, any particular composition of the substantially-transparent micrometer or sub-micrometer spheres, including micro-particles and/or nano-particles, and any interstitial voids including nano-voids established between such micrometer or sub-micrometer spheres, or to any particular composition of a transparent matrix material in which the spheres or particles may be set or fixed in any layer forming process.

Reference will be made to the employment of the disclosed exemplary energy filter or shutter components to a number of real world beneficial purposes. The discussion of any particular use case for application of the disclosed schemes should not be considered as limiting the disclosed subject matter to employment with any particular class of electrical component, electrical circuit, electronic data display devices, or any particular type of image receiving or energy/light collecting sensor components. Any electrical component installation or electronic data display device, image receiving device, or other energy/light collecting sensor component may be operationally mounted, installed or placed behind the disclosed energy filter or shutter components in use so as to be selectively hidden from view when an object or structure including any such energy filter or shutter component hiding the electrical circuit components, display devices or sensor elements when operating in an opaque mode is viewed from a viewing, observation or energy/light incident outer surface of the object or structure, including, for example, a standard wall plate. It should be recognized that any advantageous use of the disclosed schemes for employing electrically-switchable energy filters or shutter components according to the described embodiments to effect an aesthetically consistent, or aesthetically pleasing, or aesthetically changeable outward appearance of the object or structure while allowing visible, or near-visible, energy/light components to pass through employing systems, methods, techniques, processes and/or schemes such as those discussed in detail in this disclosure is contemplated as being included within the scope of the disclosed exemplary systems and methods. In this regard, the disclosed systems and methods will be described as being particularly adaptable to hiding certain electronic data display components to provide an aesthetically pleasing outward appearance when such electronic data display components are not in use as an easily-understandable and non-limiting example of a particularly advantageous use of the disclosed electrically-switchable energy filters or shutter components.

In embodiments of the systems and methods according to this disclosure, unique and advantageous energy/light directing/scattering layers scatter a small portion of an impinging energy, including light in a visual or near visual spectrum, back in a direction of an observer on a viewing, observation or energy/light incident side of the energy/light directing/scattering layer that is at least a portion of an electrically-switchable energy filter or shutter component when operating in an opaque presentation mode. In this manner, a particular surface of the energy filter or shutter component including the energy/light directing/scattering layer may appear to have a particular color in the visual spectrum, while a substantial portion of the light or other energy permissibly passes through the thin energy/light directing/scattering layer impinging on an area behind the energy filter or shutter component or on an operative surface of any underlying energy/light collecting sensor component.

General reference throughout this disclosure will be made to particular use cases in which light scattering effects may be usable to render the energy filters or surfaces of electrically-activated or electrically-switchable shutter-type components visually opaque when operated in the second mode. These references are not intended to exclude energy scattering and other portions of the electromagnetic spectrum to which certain energy scattering layers may be made to appear opaque to particular wavelengths of non-visible radiation. Nor are these references intended to imply that the energy scattering surface be rendered 100% opaque in all "second mode" operating scenarios.

Reference to any particularly useful compositions of the materials from which the disclosed micrometer or sub-micrometer spheres, preferably in a range of 25 microns or less, including micro-particles and/or nano-particles, may be formed are also descriptive only of broad classes of input materials that may be presentable in generally transparent, or seemingly transparent, micrometer or sub-micrometer sphere, micro-particle and/or nano-particle form. Suitable materials for such micrometer or sub-micrometer spheres, micro-particles and/or nano-particles may be discussed specifically according to their composition, or may be more broadly referred to by certain functional parameters, neither of which should be considered to limit the broad scope of available input materials of which such micrometer or sub-micrometer spheres, micro-particles and/or nano-particles may be formed. Additionally, typical dielectric matrices in which such sub-micrometer spheres may be stabilized will be described. Again here, any reference to a particular transparent dielectric material to promote the stabilization of particular sub-micrometer spheres in layer form are intended to be illustrative and non-limiting.

Exemplary embodiments may advantageously employ an electrically-switchable energy/light directing, light reflecting and/or light scattering layer that covers at least a portion of an outer surface of a particular 3D structure or object, including such 3D object as may be formed in any molding, machining, or AM object forming process. The energy/light directing, light reflecting and/or light scattering layer may be usable to scatter at least a portion of the impinging energy and/or light spectrum back to an observer. In a case in which visible light, for example, is scattered back to the observer, the object may give an appearance of having a particular color, or a particular pattern, or including a particular image on an outer surface of the finished object when the electrically-switchable light directing, light reflecting and/or light scattering layer is activated to provide a particular opaque appearance. Any one of a broad array of apparent chosen colors, textures or images may be presented to an observer from a viewing, observation or energy/light-incident side of the object.

Apparent colors, patterns or images of the energy/light scattering layers may be produced by adjusting refractive indices of the substantially-transparent particles according to a size of the particles, a material composition of the particles, a physical (layered) composition of the particles, a composition of a substantially-transparent matrix material in which the particles may be fixed, a presence and size of interstitial voids between the particles, a multiplicity of individual particles/matrix layers, or any combination of the above. Apparent solid colors may be produced by presenting a substantially-homogenous combination of the above parameters across a light incident surface of the energy/light scattering layer. Patterns may be produced by appropriately varying the adjustment of the refractive indices by manipulating one or more of the above parameters across the energy/light incident surface of the energy/light scattering layer. Further, apparent colors, patterns or images may be similarly produced by adjusting parameters of an electric field to which the energy/light scattering layer may be subjected. Again here, the energy/light scattering layer may be activated by a substantially consistent electric field across a surface of the energy/light scattering layer to produce an apparent solid color. Patterns may be produced by appropriately varying the electric field to which the energy/light scattering layer is subjected across the energy/light incident surface of the energy/light scattering layer.

In embodiments, virtually any object surface may be modified with the inclusion of the disclosed energy filter or shutter components, or shutter component layers, to completely mask or camouflage areas, objects, devices, sensors or the like placed behind such shutter component or shutter component layer. A roof of a structure, for example, including a commercial building or a residential home, could be covered by photocells, but still have an appearance of a typical shingled, metal, tarred or other surface-treated roof Separately, a portion of a wall of a structure, internal or external, could be embedded with photocells while maintaining an appearance of a painted surface, a textured surface, or even a particularly chosen piece of artwork. Vehicles, including automobiles and/or buses, may be provided electrically-switchable light-exposing panels on various outer surfaces so as to render the affected surfaces as appearing to consist of nothing more than normal, painted surfaces when the electrically-switchable energy/light-exposing panels may be operated in an opaque display mode.

Outer surface layers of structures, vehicles or objects may incorporate a plurality of different sensors that are masked or camouflaged so as to be visibly undetectable, or in a manner that is aesthetically correct, pleasing or required according to restrictions in an operating environment or use case. In this regard, a required or desired appearance of an outer layer of a structure or structural component may be preserved in, for example, renovation of a structure which is subject to historic preservation or other outward appearance (or of appearance-modifying) restrictions, while providing advantageous use of a light transmissive property of an object or object surface layer, and a switchable capacity to turn the aesthetically consistent panel into a transparent panel upon activation, to promote illumination of an area behind, beyond, under, or around the object or object surface that maintains the outward required or desired appearance.

Windows and/or skylights may be maintained in a generally light transparent, or light translucent, condition. When required, however, activation of the energy/light transmissive, light scattering and/or light directing layer may cause the windows and/or skylights to be shaded or even blocked out (in whole or in part).

Structures, solid object bodies, hollow object bodies, or object surface layers may be produced that are colorizable or visually texturizable without the use of pigments, paints, inks or other surface treatments that merely absorb certain wavelengths of light. The disclosed energy/light scattering layers allow determined visible, near-visible or non-visible wavelengths of energy/light to pass through the layers substantially unimpeded, while scattering other determined visible, near-visible or non-visible wavelengths of energy/light thus, in the case of visible light scattering, for example, producing a colorized look to the surface of the objects that include or incorporate the energy/light scattering layers.

Figure 1B:
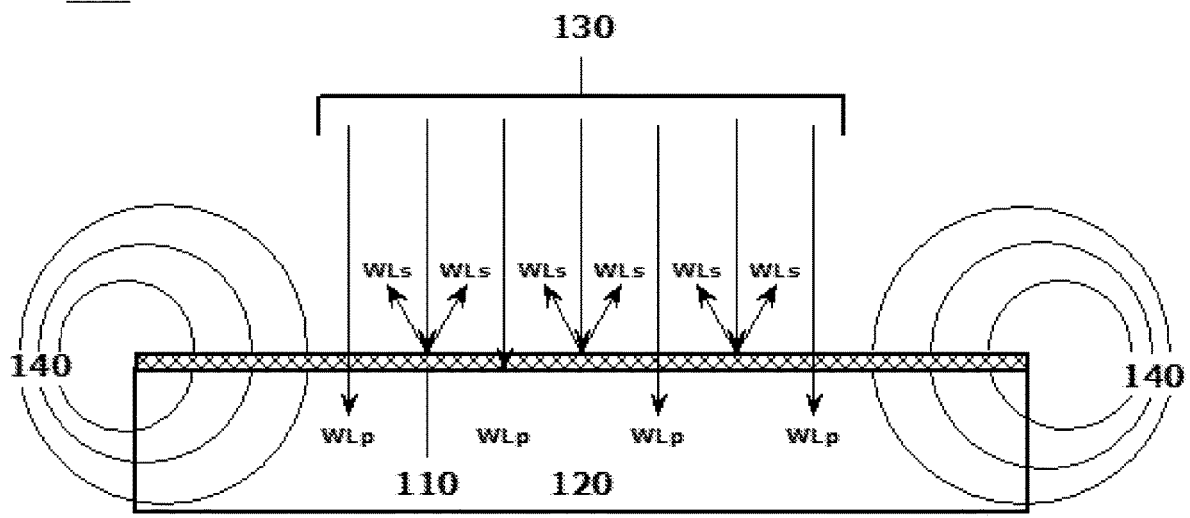

FIGS. 1A and 1B illustrate schematic diagrams of an exemplary physical body component 100 including an electrically-switchable energy/light scattering layer 110 disposed on a transparent portion 120 of a 3D body structure operating in (1) a transparent first operating mode (see FIG. 1A), and (2) an opaque second operating mode (see FIG. 1B) (depending on influence applied by an external electric field 140), according to this disclosure. As shown in FIGS. 1A and 1B, the exemplary energy/light scattering layer 110 may be comprised of a substantially homogeneous composition of micrometer or sub-micrometer spheres and matrix materials that may be separately operated on by components of an electric field 140 to turn the transparent surface shown in FIG. 1A to the energy/light-scattering (energy/light opaque appearing) surface configuration shown in FIG. 1B. In embodiments, the exemplary energy/light scattering layer 110 may be comprised of a plurality of individually-discrete (non-homogeneous) portions, each of the individually-discrete portions being caused to react or respond differently to the applied electrical field 140.

Figure 1C:
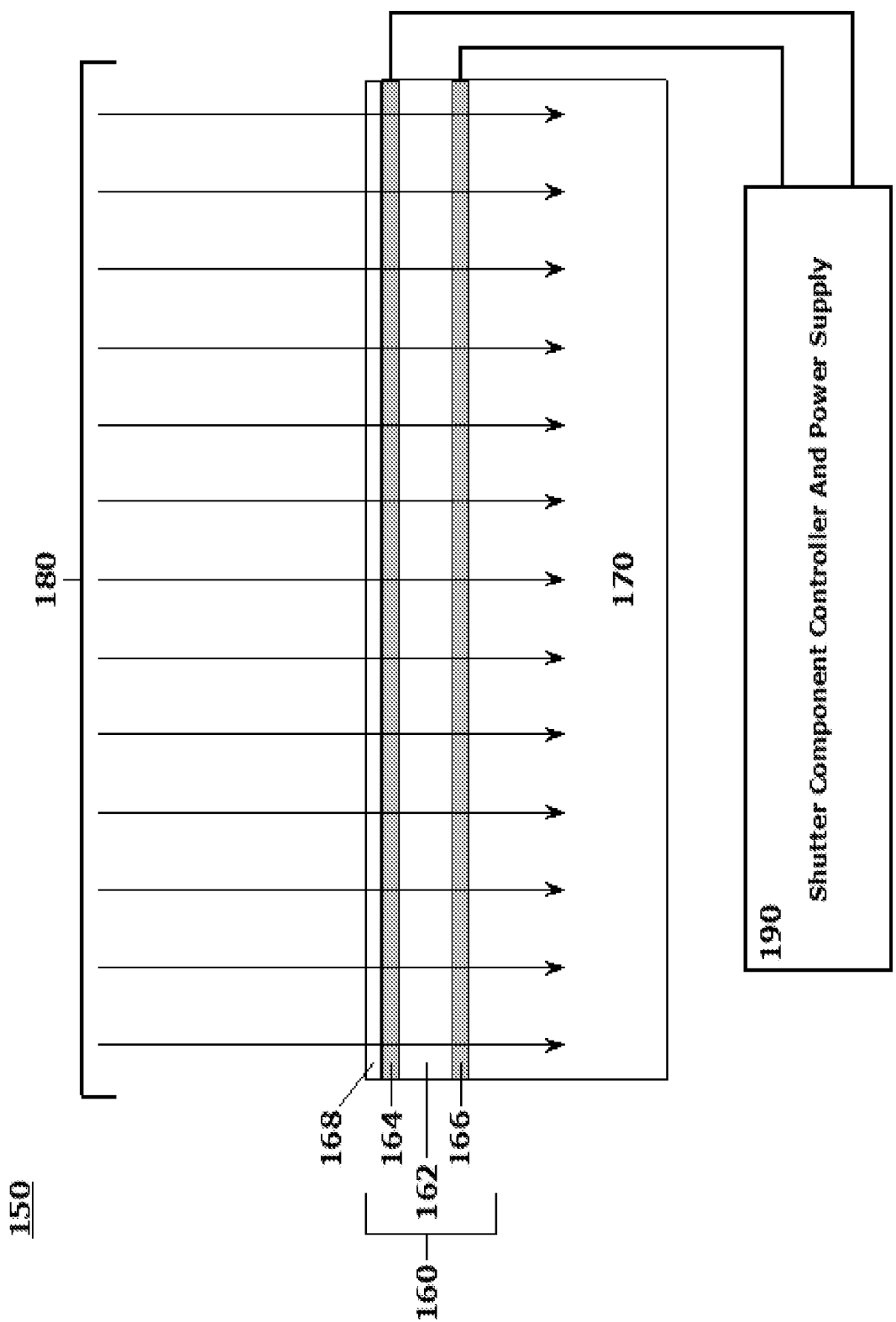
FIGS. 1C and 1D illustrate schematic diagrams of an exemplary electrically-activated energy filtering layer or shutter component including an electrically-switchable energy/light scattering layer disposed on a transparent portion of a 3D body structure operating in (1) a transparent first operating mode (see FIG. 1C), and (2) an opaque second operating mode (see FIG. 1D), according to this disclosure.
Figure 1D:
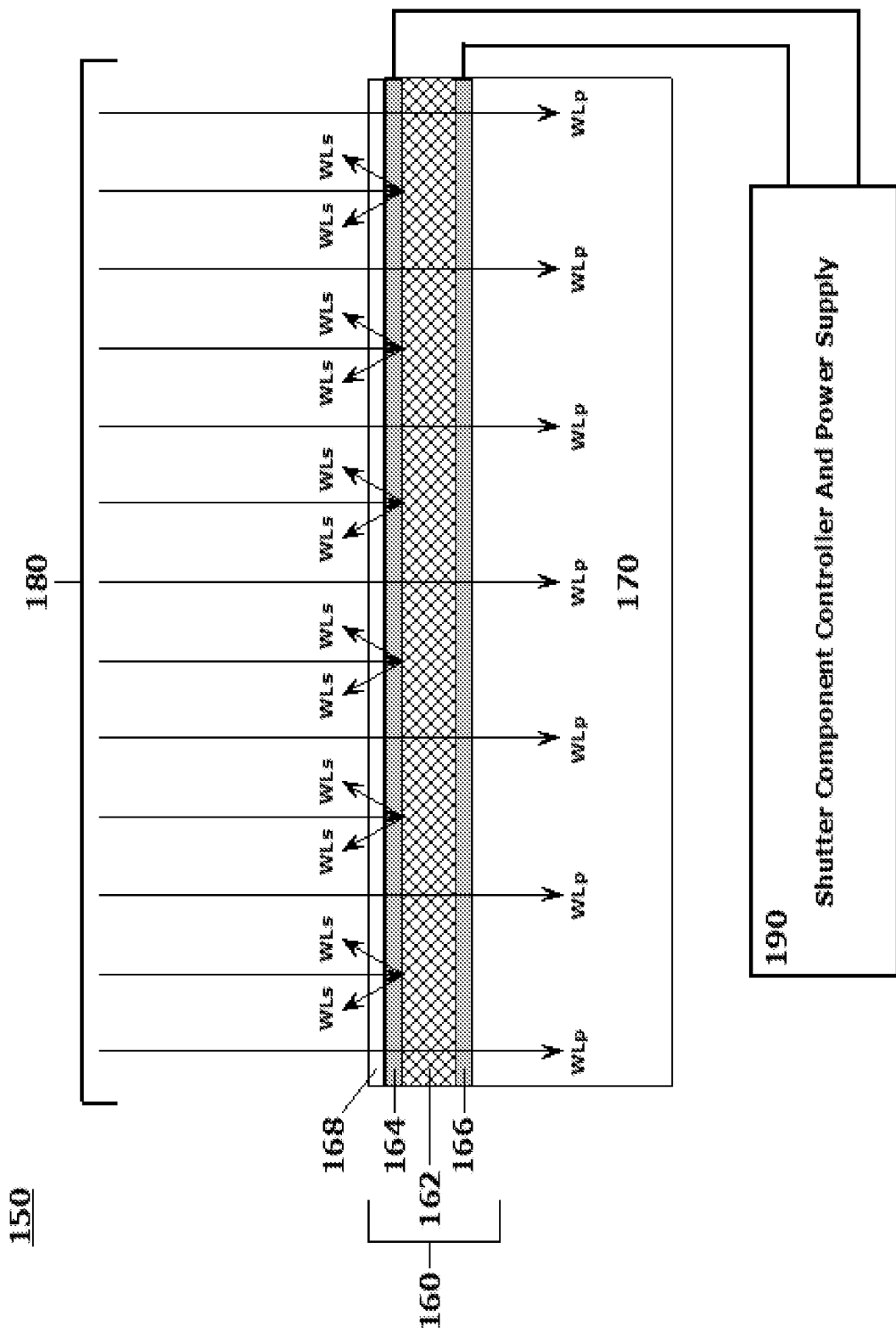

FIGS. 1C and 1D illustrate schematic diagrams 150 of an exemplary electrically-activated energy filtering layer or shutter component 160 including an electrically-switchable light scattering layer 162 disposed on a transparent portion of a 3D body structure 170 operating in (1) a transparent first operating mode (see FIGS. 1 C), and (2) an opaque second operating mode (see FIG. 1D), according to this disclosure. As shown in FIGS. 1C and 1D, the exemplary shutter component 160 may be comprised essentially of an energy/light scattering layer 162 that may be associated with one or more transparent electrodes including being sandwiched between at least one pair of transparent electrodes 114,116. For ease of depiction, the exemplary energy filter or shutter component 160 is shown as being comprised of a single energy/light scattering layer 162 sandwiched between one pair of transparent electrodes 164,166. In embodiments, it should be recognized that the energy/light scattering layer 162 may be comprised of a plurality of individually-discrete (non-homogeneous) portions, each individually-discrete portion being caused to react differently to voltages applied between a single pair of transparent electrodes 164,166, or otherwise having a discrete pair of independently-controllable transparent electrode portions associated with the each individually-discrete portion. Separately, the energy/light scattering layer 162 may be of a substantially homogeneous composition of micrometer or sub-micrometer spheres and matrix materials having a plurality of discrete pairs of independently-controllable transparent electrodes or electrode portions associated with the energy/light scattering layer 162. Embodiments may include the substantially homogenous composition to energy/light scattering layer 162, one of the pair of transparent electrodes 164,166 having a substantially unitary construction, and the other of the pair of transparent electrodes 164,166 being comprised of a plurality of independently-controllable transparent electrode portions.

Embodiments may include one or more of the pair of transparent electrodes 164,166 having etched portions in which valleys are cut into surfaces of the electrodes facing the energy/light scattering layer 162, or raised portions in which buildups are applied to surfaces of the electrodes 164,166 facing the energy/light scattering layer 162. Such etched portions or raised portions may cause a potential between the electrodes 164,166 having such features to cause a locally different electrical field component, acting differently on the energy/light scattering layer 162 to cause a locally different refractive index to be displayed. In this manner, the energy/light scattering layer 162 may display different colors or images according to the etched portions or raised portions.

A transparent protective layer 168 may be disposed on an outer surface of at least one of the pair of transparent electrodes 164,166.

In the transparent first operating mode shown in FIG. 1A, no electric field 140 may be applied, thereby allowing all of the ambient light, or light directed from a light source 130, impinging on an energy/light incident surface of the energy/light scattering layer 110 to pass through at least a portion of the energy/light scattering layer 110 essentially unimpeded and unfiltered as though penetrating a transparent piece of glass.

In the transparent first operating mode shown in FIG. 1C, each pair of transparent electrodes 164, 166 may be energized, differentially energized, or de-energized, based on signals from a shutter component controller and power supply 190, in a manner that renders the energy/light scattering layer 162, at least in the portion associated with the each pair of electrodes 164,166 (discrete electrodes or electrode portions) substantially transparent. In such a condition all of the ambient light, or light directed from a light source 180, impinging on an energy/light incident side electrode 114 (discrete electrode or electrode portion), may pass through at least a portion of the energy/light scattering 162, and the pair of transparent electrodes 164,166, essentially unimpeded and unfiltered as though penetrating a transparent piece of glass.

In the opaque second operating mode shown in FIG. 1B, an electric field 140 may be applied to at least portions of the energy/light scattering layer 110 to cause the energy/light scattering layer 110 to allow first determined wavelengths of light, WLp, to pass through the energy/light scattering layer 110 in portions upon which the electric field 140 acts. The configuration of the energy/light scattering layer 110 simultaneously causes certain second determined wavelengths of light, WLs, impinging on the energized portion of the energy/light scattering layer 110 to be scattered back in an incident direction substantially as shown.

In the opaque second operating mode shown in FIG. 1D, each pair of transparent electrodes 164,166 may be energized, differentially energized, or de-energized, based on signals from the shutter component controller and power supply 190, in a manner that renders the energy/light scattering layer 162 (or any individually controlled discrete portion thereof) substantially opaque. Here, as energized, the energy/light scattering layer 162 is configured to allow first determined wavelengths of light, WLp, to pass through the energy/light scattering layer 162 in the energized portion. The configuration of the energy/light scattering layer 162 simultaneously causes certain second determined wavelengths of light, WLs, impinging on the energized portion of the energy/light scattering layer 162 to be scattered back in an incident direction substantially as shown.

As is noted above, and as will be described in greater detail below, the energy/light scattering layers 110,162 may be configured of substantially-transparent particles in a form of micrometer or sub-micrometer spheres, having particle diameters of 24 microns or less and including micro-particles or nano-particles, and interstitial voids, which may include nano voids, between the substantially-transparent particles. The substantially-transparent particles may be stabilized in structural or other layers further comprised of substantially-transparent dielectric materials, is a unitary layer or in discrete layer portions. An ability to configure the substantially-transparent particles in the opposing electrode structure of the shutter component 160 may provide a capacity to selectively "tune" the energy/light scattering surface of the energy/light scattering layer 162, overall, or in discrete portions, to scatter particular second determined wavelengths of light, WLs, to produce a desired visual appearance in a single color, multiple colors, or an image-wise visual presentation provided by the energy/light scattering layer 162 as activated by one or more opposing pairs of transparent electrodes 164,166. Put another way, depending on a particular composition of the components comprising the energy/light scattering layer 162, and the selective energy input to the energy/light scattering layer 162 by the pair of transparent electrodes 164,166, across the entire surface of the energy/light scattering layer 162, or in discrete portions thereof, one or more colors, textures, color patterns, or color-patterned images may be visually produced by the energy/light scattering layer 162 of the exemplary energy filter or shutter component 160 in the opaque second operating mode.

A voltage, or voltage differential, passing between the (or each) pair of transparent electrodes 164,166, as controlled by the shutter component controller and power supply 190, may be adjusted to cause a change in an index of refraction of the particles comprising the energy/light scattering layer 162, the binder material fixing the particles in the light scattering layer 162, or both of the particles and the binder material making up the energy/light scattering layer 162, or any discrete and separately energized and/or controlled portion thereof. The (or each) pair of transparent electrodes 164,166 is electrically-conductive, yet thin enough to allow for transmission of light therethrough.

The light scattering effect of the energy/light scattering layer 160 may be produced in response to illumination generally from ambient light in a vicinity of, and/or impinging on, the surface of the energy/light scattering layer 62, as modified by the voltages imparted by the pair of transparent electrodes 164,166. Alternatively, the light scattering effect of the energy/light scattering layer 162 may be produced in response to direct illumination generally produced by the directed light source 180 focusing illumination on the surface of the energy/light scattering layer 162, again as modified by the voltages imparted by the (or each) pair of transparent electrodes 164,166.

In the general configuration shown in FIGS. 1C and 1D, the exemplary energy filter or shutter component 160 is formed over the transparent 3D body structure 170 in a manner that allows substantially all of the light in the transparent first operating mode, or the first determined wavelengths of light, WLp, in the opaque second operating mode, to pass not only through the exemplary energy filter or shutter component 160, including the energy/light scattering layer 162, but also to pass further through the transparent 3D body structure 170 in a substantially unfiltered manner that allows an area or sensor positioned in, under, or behind the transparent 3D body structure 170, or behind the energy/light scattering layer 170 and, for example, embedded in the transparent 3D body structure 170, to be illuminated in a manner as though substantially all the light, or those first determined wavelengths of light, WLp, may have been otherwise caused to pass unfiltered through a glass, plastic, or other transparent outer covering or protective layer 168. In this manner, substantially all the light, or the first determined wavelengths of the light, WLp, passing through the exemplary energy filter or shutter component 160, and the transparent 3D body structure 170, may provide significant light energy to simply illuminate an area shadowed by the transparent 3D body structure 170, or to be employed as appropriate by any manner of light detection component, including any light-activated, light-absorbing, light-employing, or otherwise operationally light-involved sensor positioned in or behind all or a portion of the transparent 3D body structure 170.

The exemplary energy filter or shutter component 160 may be provided as a standalone unit as a part of a fixed or movable structural component including, but not limited to, a door, a window, a skylight, a part of the wall, a panel in a piece of furniture, or the like. Regardless of installation, an ability to be made selectively transparent, or otherwise selectively opaque (at least in one direction) may present essentially limitless applications for use. Consider, for example, an ability to adapt such an exemplary energy filter or shutter component 160 for use in an art museum in which museum artifacts may be selectively exposed for viewing but otherwise hidden for security and/or preservation purposes. Separately, such an exemplary energy filter or shutter component 160 may be adapted for myriad uses in vehicles.

Figure 2:
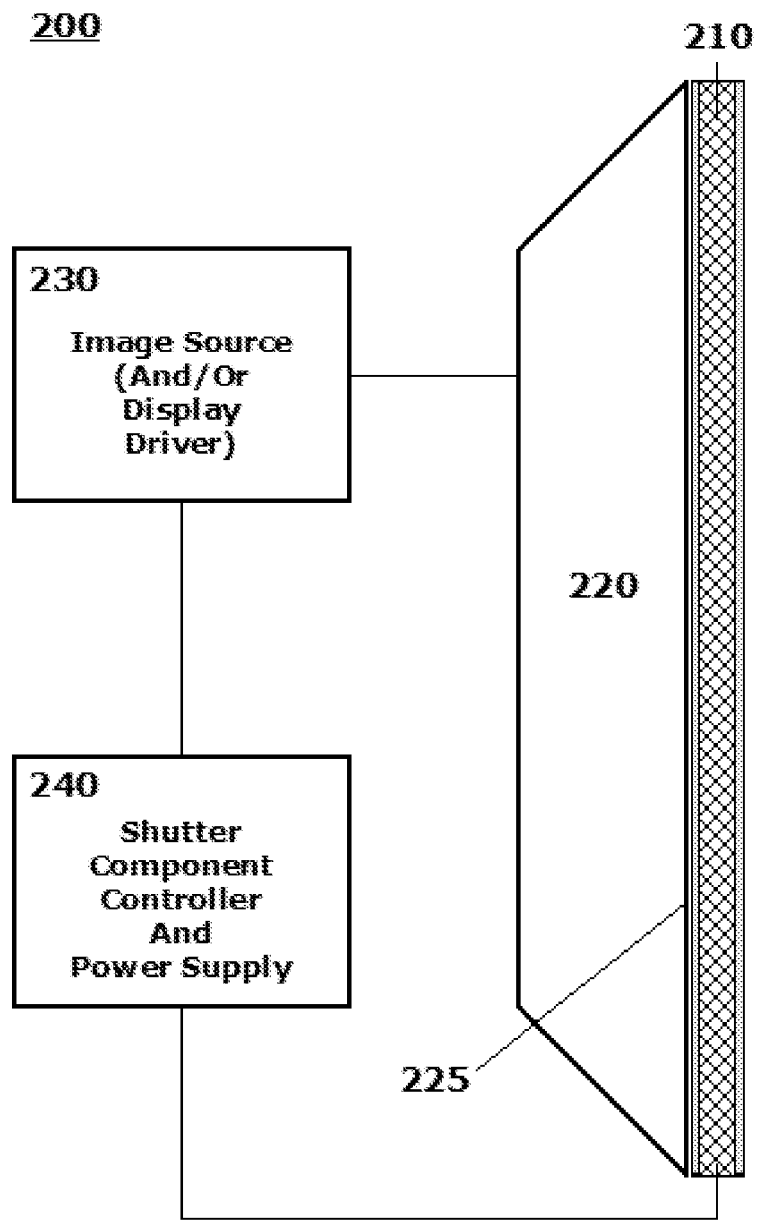
FIG. 2 illustrates a schematic diagram of an exemplary electrically-switchable energy filter or shutter component disposed in front of the display surface of a display component for operatively hiding or exposing the display component in use according to this disclosure.

FIG. 2 illustrates a schematic diagram 200 of an exemplary electrically-switchable energy filter or shutter component 210 disposed in front of a display surface 225 of a display component 220 for operatively hiding or exposing the display component 220 in use according to this disclosure. In embodiments, the energy filter or shutter component 210 maybe installed as a portion of a wall in a structure or a door or panel on a piece of furniture behind which, or in which, the display component 220 in a form of, for example, a television, another entertainment content display device, or a computer display device, may be housed. Again here, it should be recognized that, although depicted as a substantially unitary structure, the energy filter or shutter component 210 may comprise myriad individually discrete light scattering layer portions, or individually discrete electrode portions. In operation, the display component 220 may be driven by signals from an image source and/or display driver 230. Such image source and/or display driver 230 may communicate with the shutter component control and power supply 240 such that when the display component 220 is driven by the image source and/or display driver 230 to display an image, a signal is provided to the shutter component controller and power supply 240 to render the exemplary energy filter or shutter component 210 transparent. Conversely, when a display on the display component 220 is ended and/or removed by the image source and/or display driver 230, a signal may be provided to the shutter component controller and power supply 240 to render the exemplary energy filter or shutter component 210 opaque, thereby hiding the display component 220 behind the exemplary energy filter or shutter component 210.

Figure 3:
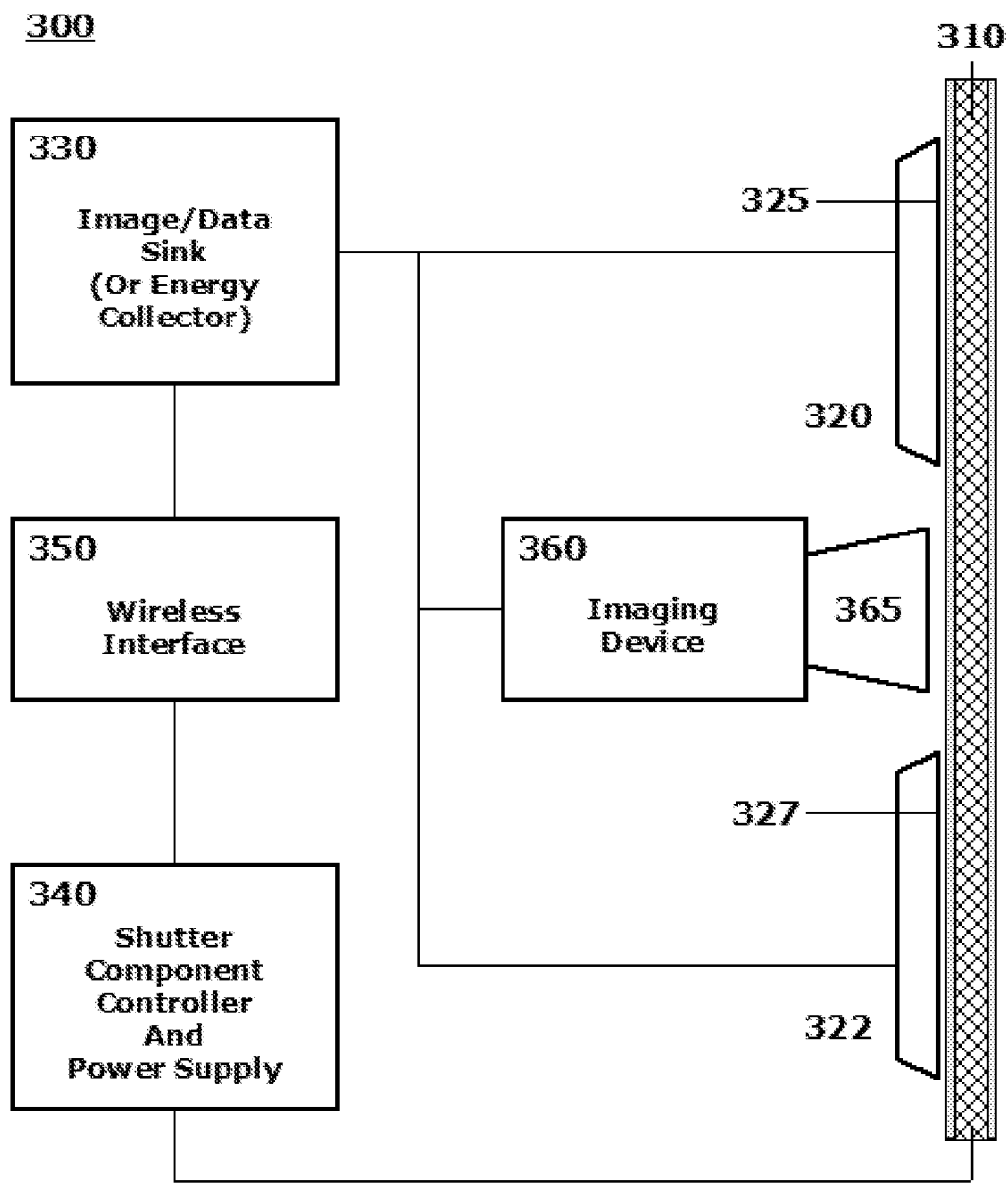
FIG. 3 illustrates a schematic diagram of an exemplary electrically-switchable energy filter or shutter component disposed in front of a selection of image collection and/or sensor array devices for operatively hiding or exposing the devices in use according to this disclosure.

FIG. 3 illustrates a schematic diagram 300 of an exemplary electrically-switchable energy filter or shutter component 310 disposed in front of a selection of image collection and/or sensor array devices for operatively hiding or exposing the devices in use according to this disclosure. In embodiments, the energy filter or shutter component 310 may be installed as a portion of a wall in a structure or a door or panel on a piece of furniture behind which, or in which, one or more sensor arrays 320,322 (having respective sensing surfaces 325,327), or one or more active imaging devices 360 (having an image collection lens 365), or any combination thereof, may be housed. In operation, the sensor arrays 320,322, and/or the active imaging device 360, may provide signals to an image/data sink 330 (or energy collector in a case in which the one or more sensor arrays 320,322 comprise photoelectric generation devices). Again here, it should be recognized that, although depicted as a substantially unitary structure, the energy filter or shutter component 310 may comprise myriad individually discrete light scattering layer portions, or individually discrete electrode portions. The signals may be provided via wired communication between the components or via, for example, some manner of wireless interface 350, or both. Separate signals may be provided between the image/data sink 330 and a shutter component control and power supply 340 in order that the exemplary shutter component 310 be rendered transparent, or even momentarily transparent, during image collection by the imaging device 360, or other parameter sensing by the sensor arrays 320,322. Conversely, when the imaging device 360, or the sensor arrays 320,322, are being otherwise operated for passive collection and the light passing through an opaqued operating surface for the exemplary energy filter or shutter component 310 may be acceptable, a signal may be provided from the image/data sink 330 to the shutter component controller and power supply 340 to render the exemplary energy filter or shutter component 310 opaque, thereby hiding the imaging device 360 and/or the sensor arrays 320,322 behind the exemplary energy filter or shutter component 310.

When employing a wireless interface 350, any compatible wireless signal processing protocol may be used including, but not limited to, Wi-Fi, WiGig, Bluetooth®, Bluetooth Low Energy (LE)® (also referred to as Bluetooth Smart® or Version 4.0+ of the Bluetooth® specification), ZigBee®, or other similar wireless signal processing protocol.

Although depicted as discrete sensor arrays 320,322 for ease of illustration and understanding, the sensor arrays 320,322 may comprise a substantially integrated, and/or unitary, array placed behind an entire surface of the exemplary energy filter or shutter component 310.

In embodiments, any of the above described exemplary energy filter or shutter components 160,210,310 may include other laminated layers including, but not limited to protective outer layers over any one or more of the exposed surfaces (including the electrodes) of the exemplary shutter components 160,210,310. See, e.g., element 168 in FIGS. 1C and 1D. Such laminated protective outer layers may be formed of a glass, a plastic, and/or any other light transparent composition.

Figure 4:
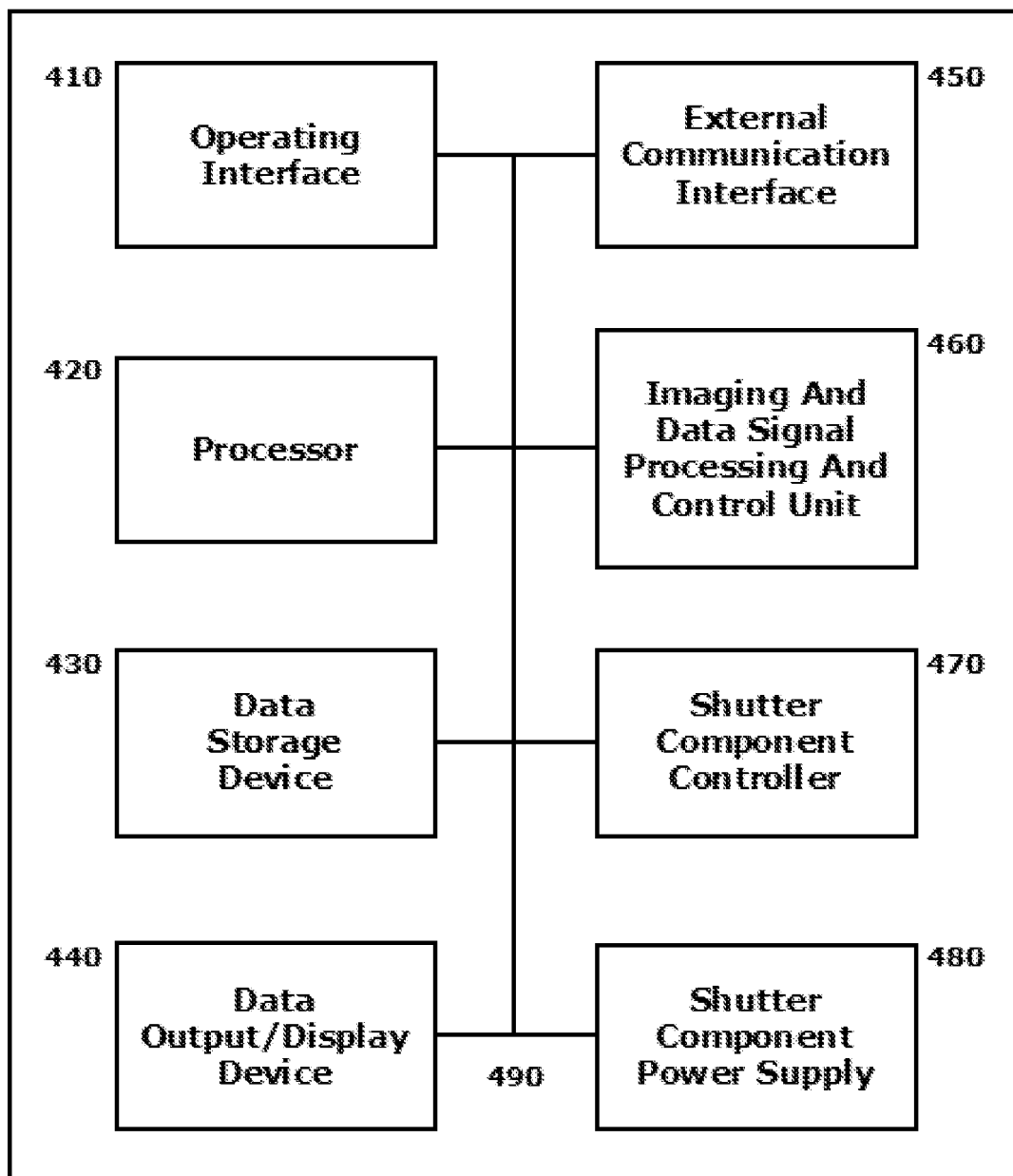
FIG. 4 illustrates a block diagram of an exemplary control system for controlling at least one of electronic data display and electrical/electronic/image signal receiving and processing in coordination with operation of an electrically-switchable energy filter or shutter component according to this disclosure.

FIG. 4 illustrates a block diagram of an exemplary control system 400 for controlling at least one of electronic data display and electrical/electronic/image signal receiving and processing in coordination with operation of an electrically-switchable energy filter or shutter component according to this disclosure. The exemplary control system 400 may provide input to electronic data display devices, or receive signals from imaging devices or sensor arrays for coordinated operation of an electrically-switchable energy filter or shutter component that overlies one or more of the electronic data display devices, imaging devices or sensor arrays in the manner shown in at least FIGS. 2 and 3 above.

The exemplary control system 400 may include an operating interface 410 by which a user may communicate with the exemplary control system 400. The operating interface 410 may be a locally-accessible user interface associated with, for example, a particular display device image capture device. The operating interface 410 may be configured as one or more conventional mechanism common to control devices and/or computing devices that may permit a user to input information to the exemplary control system 400. The operating interface 410 may include, for example, a conventional keyboard, a touchscreen with "soft" buttons or with various components for use with a compatible stylus, a microphone by which a user may provide oral commands to the exemplary control system 400 to be "translated" by a voice recognition program, or other like device by which a user may communicate specific operating instructions to the exemplary control system 400. The operating interface 410 may particularly provide the user an opportunity to directly or indirectly control the operating modes of the electrically-switchable shutter component in a manual, semi-automated or fully automated manner.

The exemplary control system 400 may include one or more local processors 420 for individually operating the exemplary control system 400 and for carrying into effect control and operating functions for the electrically-switchable energy filter or shutter component, and any display devices, image capture devices, or sensor arrays with which the electrically-switchable energy filter or shutter component may be associated. Processor(s) 420 may include at least one conventional processor or microprocessor that interpret and execute instructions to direct switching of the electrically-switchable energy filter or shutter component between operating modes based on operation of at least one of the display device, an image capture device, or a sensor array covered by the electrically-switchable energy filter or shutter component.

The exemplary control system 400 may include one or more data storage devices 430. Such data storage device(s) 430 may be used to store data or operating programs to be used by the exemplary control system 400, and specifically the processor(s) 430. Data storage device(s) 430 may be used to store information regarding, for example, under what circumstances and operation of the one or more of the display devices, the image capture device and/or the sensor array, the electrically-switchable energy filter or shutter component should be rendered transparent or opaque.

The data storage device(s) 430 may include a random access memory (RAM) or another type of dynamic storage device that is capable of storing updatable database information, and for separately storing instructions for execution of system operations by, for example, processor(s) 420. Data storage device(s) 430 may also include a read-only memory (ROM), which may include a conventional ROM device or another type of static storage device that stores static information and instructions for processor(s) 420. Further, the data storage device(s) 430 may be integral to the exemplary control system 400, or may be provided external to, and in wired or wireless communication with, the exemplary control system 400, including as cloud-based data storage components.

The exemplary control system 400 may include at least one data output/display device 440, which may be configured as one or more conventional mechanism that output information to a user, including, but not limited to, the display device that is controlled by the exemplary control system 400, the control inputs of which are coordinated by the exemplary control system 400 to match operating modes of the electrically-switchable energy filter or shutter component.

The exemplary control system 400 may include one or more separate external communication interfaces 450 by which the exemplary control system 400 may provide wireless communication by which to communicate with components external to the exemplary control system 400 including, but not limited to, any associated display device, any associated imaging device, any associated sensor array, and the electrically-switchable energy filter or shutter component with which the exemplary control system 400 is associated for operation. At least one of the external communication interfaces 450 may be configured as an output port (and power supply) to send signals to the transparent electrodes of the electrically-switchable energy filter or shutter component in response to operating instructions for the energy/light scattering layer of the electrically-switchable energy filter or shutter component to render the energy/light scattering layer correctly transparent and opaque in the coordination with operation of the system components. Any suitable data connection to provide wired or wireless communication between the exemplary control system 400 and external and/or associated components is contemplated to be encompassed by the depicted external communication interface 450.

The exemplary control system 400 may include an imaging and data signal processing and control unit 460. The imaging and data signal processing and control unit 460 may be used to (1) provide imaging inputs and other data signals to a display device, (2) receive imaging inputs from an imaging device, (3) receive sensor inputs from a sensor array, and (4) in a case in which a sensor array constitutes an array of photovoltaic cells, receive and collect generated electrical energy from the array of photovoltaic cells. The imaging and data signal processing and control unit 460 may operate as a part or a function of the processor 420 coupled to one or more of the data storage devices 430, or may operate as a separate stand-alone component module or circuit in the exemplary control system 400. Either of the processor 420 or the imaging and data signal processing and control unit 460 itself, may be particularly programmed to parse input and output signals and to determine from a constitution of those signals which motive operation the electrically-switchable energy filter or shutter component should be operating in at any given time with respect to operation of the other associated devices.

The exemplary control system 400 may include a shutter component controller 470 as a part or a function of the processor 420 coupled to one or more of the data storage devices 430, or as a separate stand-alone component, module or circuit in the exemplary control system 400. The shutter component controller 470 may be usable to control the functioning of the energy filter or shutter component by determining appropriate voltages to be sent to one or more of the electrodes to properly energize, differentially energize, or de-energize one or more electrodes to provide proper operation of the electrically-switchable energy filter or shutter component.

The exemplary control system 400 may include a separate shutter component power supply 480 that, under the control of the shutter component controller 470, may be caused to generate the messages appropriate to energize, differentially energize, or de-energize one or more of the electrodes of the electrically-switchable energy filter or shutter component in operation.

All of the various components of the exemplary control system 400, as depicted in FIG. 4, may be connected internally, and to one or more external components as enumerated above, by one or more data/control busses 490. These data/control busses 490 may provide wired or wireless communication between the various components of the exemplary control system 400, whether all of those components are housed integrally in, or are otherwise external and connected to the electrically-switchable shutter component, display devices, imaging devices and/or sensor arrays with which the exemplary control system 400 may be associated.

It should be appreciated that, although depicted in FIG. 4 as an integral unit, the various disclosed elements of the exemplary control system 400 may be arranged in any combination of sub-systems as individual components or combinations of components, integral to a single unit, or external to, and in wired or wireless communication with the single unit of the exemplary control system 400. In other words, no specific configuration as an integral unit or as a support unit is implied by the depiction in FIG. 4. Further, although depicted as individual units for ease of understanding of the details provided in this disclosure regarding the exemplary control system 400, it should be understood that the described functions of any of the individually-depicted components, and particularly each of the depicted control units, may be undertaken, for example, by one or more processors 420 connected to, and in communication with, one or more data storage device(s) 430.

Figure 5A:
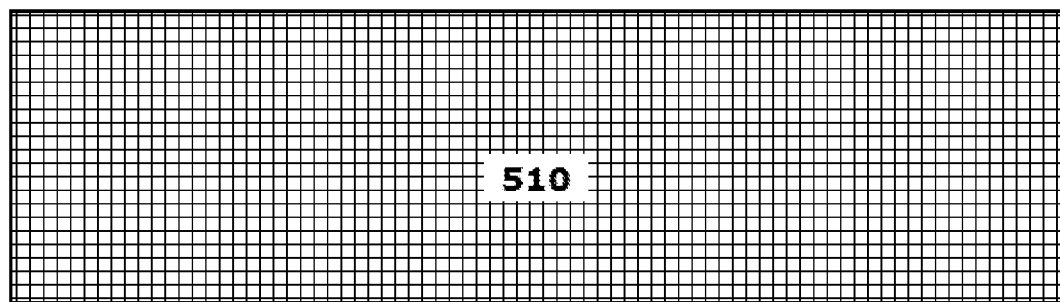
FIGS. 5A-5C illustrate exemplary depictions of an opaque side presentation of an electrically-switchable energy filter or shutter component including an energy/light scattering layer according to this disclosure viewed in plan form from a viewing, observation or energy/light-incident side.
Figure 5B:
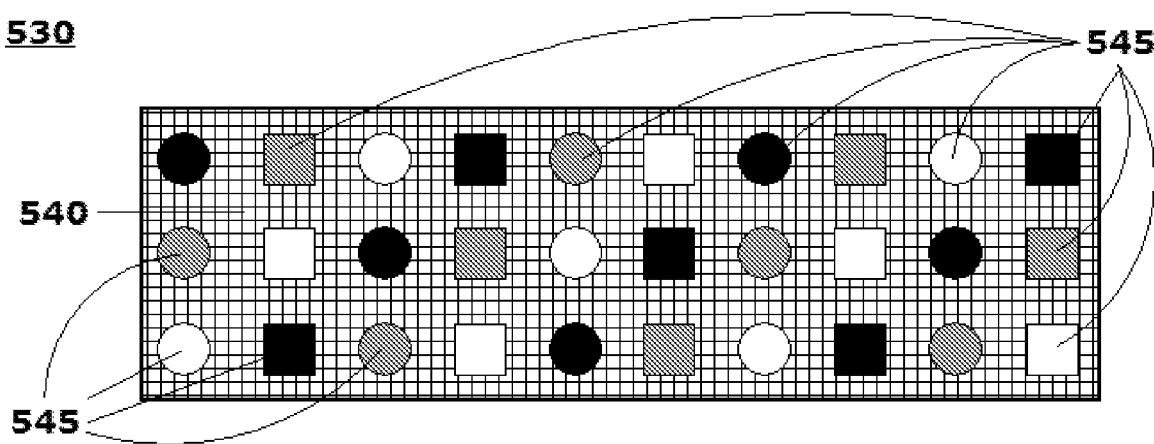
Figure 5C:
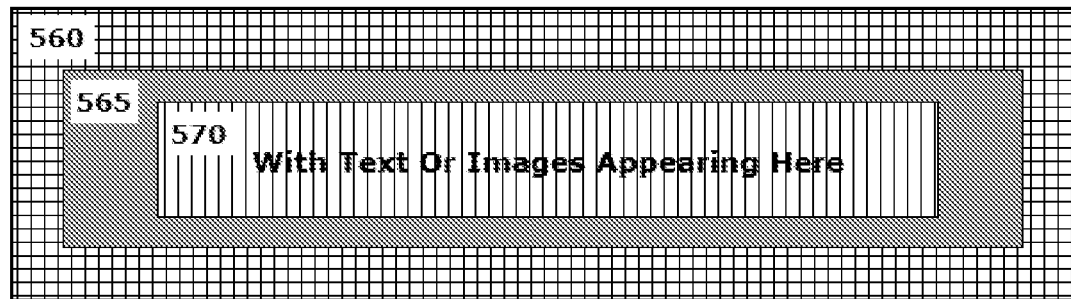

FIGS. 5A-5C illustrate exemplary depictions of energy/light scattering surface layers in operatively opaque condition in an electrically-switchable energy filter or shutter component according to this disclosure viewed in plan form from a viewing, observation or energy/light-incident side. As shown in FIG. 5A, the exemplary embodiment 500 includes an energy/light scattering surface layer that is formed to be energized by an electric field or by the electrodes of the electrically-switchable energy filter or shutter component to scatter a same wavelength of light, WLs, across an entire light scattering surface layer thus producing a single visible color 510. As shown in FIG. 5B, the exemplary embodiment 530 includes an energy/light scattering surface layer that is formed to be energized by the electrodes of the electrically-switchable energy filter or shutter component, or to be differentially energized by discrete combinations of electrodes of the electrically-switchable energy filter or shutter component, so as to scatter a first wavelength of light, WLsi, as a background color 540, and a plurality of second wavelengths of light, WLs, as other color/texture portions 545. The plurality of second wavelengths of light, WLs, producing color/texture portions 545 may be formed in the energy/light scattering surface layer and configured to scatter one or more second determined wavelengths of light, WLs, only within determined areas of the energy/light scattering surface layer to thus produce some manner of a multi-color and/or textured appearance in the light scattering surface layer. As shown in FIG. 5C, the exemplary embodiment 550 includes an energy/light scattering surface layer that is formed to be energized by the electrodes of the electrically-switchable energy filter or shutter component, or to be differentially energized by discrete combinations of electrodes of the electrically-switchable energy filter or shutter component, so as to scatter a first wavelength of light, WLsi, as a first background color 560, a second (or more) wavelengths of light, WLs2, as second intermediate background color(s) 565, and a plurality of third wavelengths of light, WLs, as color/texture/image portions 570. The plurality of third wavelengths of light, WLs, as the color/texture/image portions 570 may be formed in the energy/light scattering surface layer and configured to scatter one or more third determined wavelengths of light, WLsn, within determined areas of the energy/light scattering surface layer to thus produce some manner of a multi-color, multi-texture and/or image-wise appearance in the light scattering surface layer.

In all of the embodiments described above, it should be appreciated that the various energy/light scattering layers may be formed in a manner to allow the first determined wavelengths of light, WLp, to pass through the energy/light scattering layers as selected wavelengths in a visible, near-visible or non-visible range, and to allow the second determined wavelengths of light, WLs(x), to be scattered as selected wavelengths primarily in the visible range. See generally FIG. 1D.

Figure 6:
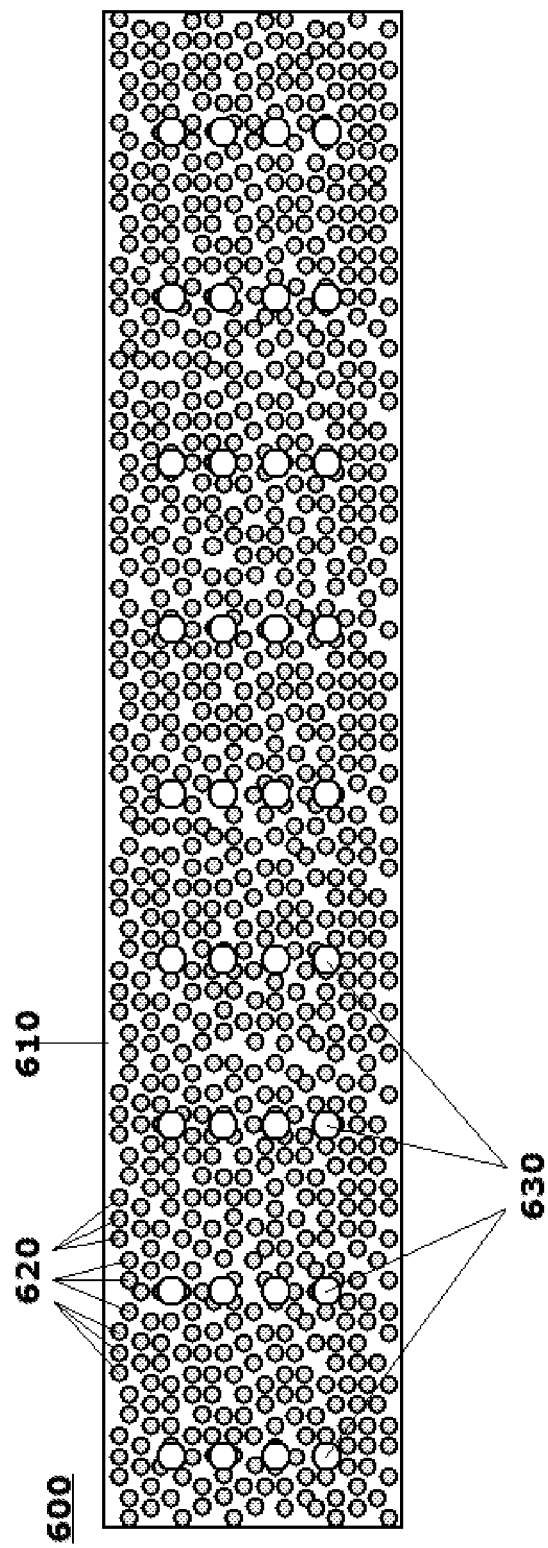
FIG. 6 illustrates an exemplary embodiment of a detail of an energy/light scattering layer usable in structuring an electrically-switchable energy filter or shutter component according to this disclosure.

FIG. 6 illustrates an exemplary embodiment of a detail of an energy/light scattering layer 600 usable in an electrically-switchable energy filter or shutter component according to this disclosure. The disclosed schemes, processes, techniques or methods may employ an energy/light scattering layer 600 created using substantially-transparent micrometer or sub-micrometer spheres that may be in a form of nano-particles, including metal nano-particles 620, embedded in a substantially-transparent matrix 610, which may be constituted as a dielectric matrix. As an example, the metal nano-particles 620 may include barium titanate (BaTiO4) or strontium titanate (SrTiO4) nano-particles. Further, the energy/light scattering layer 600 may include random or patterned voids 630 in the energy/light scattering layer 600, or through the energy/light scattering layer 600. In embodiments, patterned voids 630, such as those shown in FIG. 6, may reduce or substantially eliminate any need to otherwise filter light impinging on a camera lens or other imaging device sensor.

Figure 7:
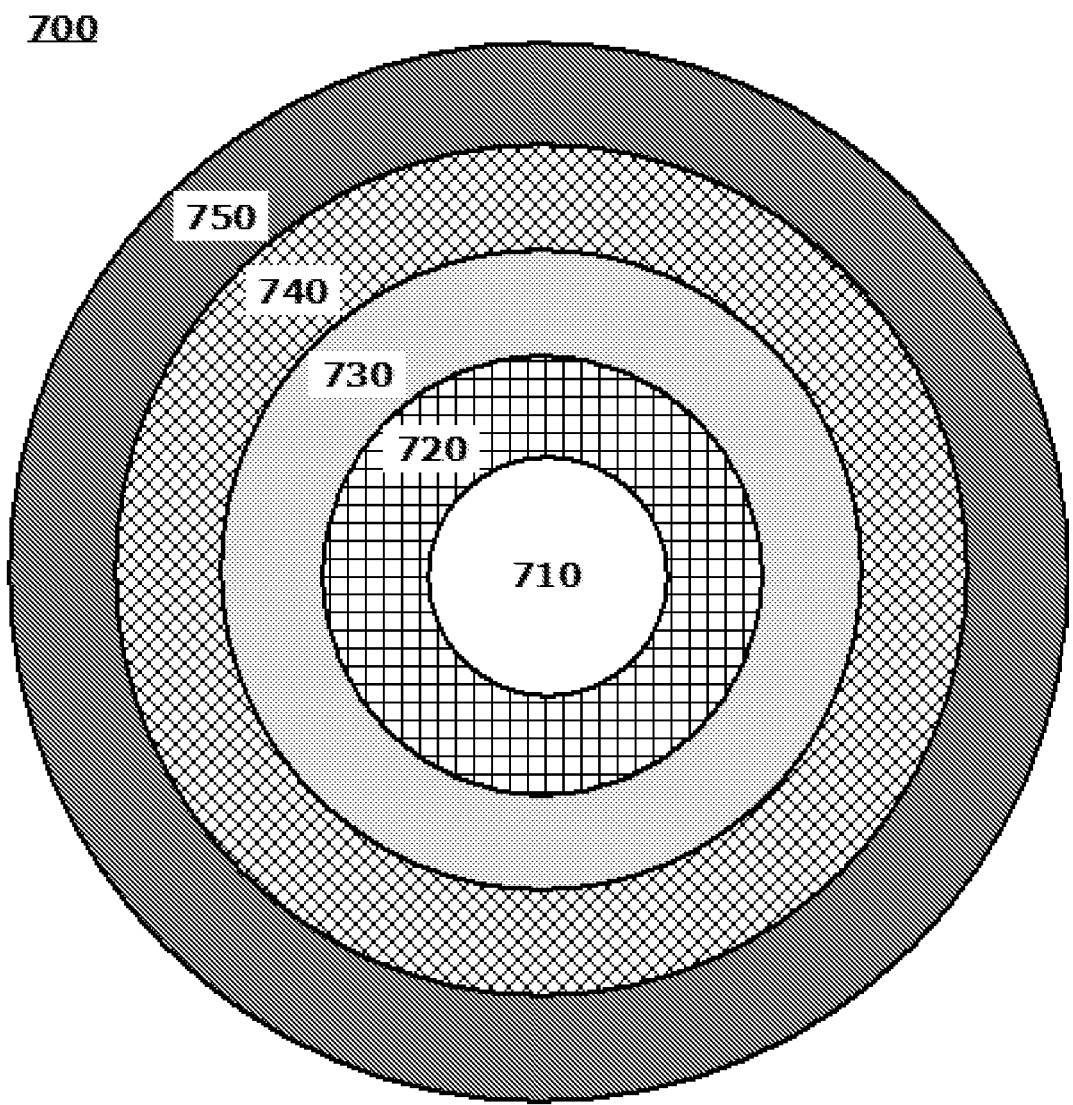
FIG. 7 illustrates a schematic diagram of an exemplary detail of a multi-layer individual micrometer or sub-micrometer sphere usable in forming an energy/light scattering layer as a portion of an electrically-switchable energy filter or shutter component according to this disclosure.

FIG. 7 illustrates a schematic diagram of an exemplary detail of a multi-layer individual micrometer or sub-micrometer sphere 700 usable in an energy/light scattering layer as a portion of an electrically-switchable energy filter or shutter component according to this disclosure. The substantially-transparent particles of the disclosed embodiments may be of layered construction as shown. Each layer 710-750 may exhibit a different index of refraction and different rate of change of index of refraction in response to an applied electric field that is formed by the voltage potential applied to the electrodes. The number of layers may be varied over a range required by a particular application and/or use case. This allows for additional degrees of freedom in adjusting the color, transmission and scattering, i.e., in "tuning" the light scattering effects produced by the composition of the energy/light scattering layer, and the manner by which the individual particles respond to an applied electric field or to the electric voltage applied between the electrodes.

Colors of composites containing noble metal inclusions may be tuned based on surface plasmon resonance (SPR) for the composites in the metallic phase. Light scattering layers comprising films with well separated embedded metallic nano-particles, in dimensions significantly smaller than the wavelengths of the exciting light, may be characterized by a peak in the visible range of the absorption spectra. The bandwidth, intensity and possession of a maximum effect may depend on the composition of the surrounding dielectric matrix, and the size, distribution and shape of the metallic nano-particles. An ability to control these physical properties of substantially-transparent constituent components allows tuning of the optical properties of a composite material from which the light scattering layer may be formed. This tuning of the optical properties of the composite material may include one or more of (1) changing a refractive index of the matrix (NH) and (2) modifying the morphology and distribution of the metallic inclusions, thereby changing an aspect ratio of the metallic nano-particles. By applying a combination of plasmon resonance, and scattering of light by particles, the appearance of the color of an object having a light scattering surface layer comprised of substantially-transparent micrometer or sub-micrometer spheres, including components of the above-described exemplary nano-particles, can be directly and precisely controlled.

The electric field, including from the potential on the pair of opposing electrodes, is usable to change the index of refraction and dielectric constant of the binder around the metal particles. This will change the plasmonic resonant frequency of the nano-structure, which further increases the variability and precision with which the energy/light scattering layer can be tuned, thus substantially enhancing the utility of the disclosed electrically-switchable energy filter or shutter component.

Final optical properties, or characteristics, of the energy/light scattering layer may be controlled and/or determined using a scattering theory. An example of such a scattering theory is the Mie Theory or the Mie Solution to Maxwell's Equations, which describes the scattering of an electromagnetic plane wave by a homogeneous sphere. The Mie Solution takes the form of an infinite series of spherical multipole partial waves. See generally Stratton, J. A., Electromagnetic Theory, McGraw-Hill (1941).

In embodiments, an apparent color or colors of the energy/light scattering layer may be created using the substantially-transparent micrometer or sub-micrometer spheres. One or more orders of multi layers may be formed by evaporating water from, for example, polystyrene latex suspensions, which may contain monodisperse spherical particles of a diameter smaller than the wavelength of visible light. See, e.g., Dushkin et al., "Colored Multilayers from Transparent Submicrometer-Spheres," Protein Array Project, ERATO, JRDC, 5-9-1 Tokodai, Tsukuba, 300-26, Japan (May 28, 1993). The color and transmission properties of the energy/light scattering layer in the electrically-switchable energy filter or shutter component can be changed and/or adjusted through an application of the methods potential to the pair of opposing electrodes thereby forming an electric field between the electrodes. This electric field interacts with the substantially transparent micrometer or sub-micrometer particles and the binder matrix within which the micrometer or sub-micrometer particles are fixed.

With reference to FIGS. 1A-1D above, it should be understood that an area of interest may be defined according to a supporting structure composed of substantially any material that will support at least the energy/light scattering layer or the first electrode layer. The body structure 120,170 described with reference to FIGS. 1A-1D is defined as substantially transparent because it is intended for the wavelengths of energy/light passing through the exemplary energy filter or shutter component to continue through the substantially transparent body structure to illuminate an underlying area or to activate a lights collecting component device located in the shadow of the body structure.

There will be, however, examples in which an underlying body structure is not transparent as in the embodiments shown in FIGS. 2 and 3 above. Consider an example in which an underlying area of interest could be an LCD display that needs to be hidden from view until operated. Such an LCD display that would constitute an area of interest that is not, of itself, light transmissive. In other words, there may be use cases and applications in which the opaque shuttering effect may be limited, or otherwise modified, by an existence of an underlying structure.

In embodiments, a conductive layer such as, for example, graphene may be deposited in a plasma-assisted chemical vapor deposition (CVD) to produce an atomically-thin layer. Binder matrix and particle layers may be applied concurrently or sequentially according to inherent material processing limitations. Techniques for applying these layers may include separate plasma-assisted CVD, sputtering, atomic layer deposition (ALD), ionic self-assisted monolayer deposition and other such methods. Another conductive layer may then be applied in any of the disclosed manners to achieve the electrically-switchable shutter component structure. Protective layers may be separately applied according to the laminating methods, processes and techniques.

Care is taken in the application of the electrodes and the subsequent application of voltage is easily and reliably achieved, except in circumstances it is intended that the voltage be induced through means other than direct contact of the electrodes with the components of the light scattering layer, substantially in the manner depicted and described above with respect to FIGS. 1A and 113, which do not include transparent electrodes as part of the switchable structure.

Figure 8:
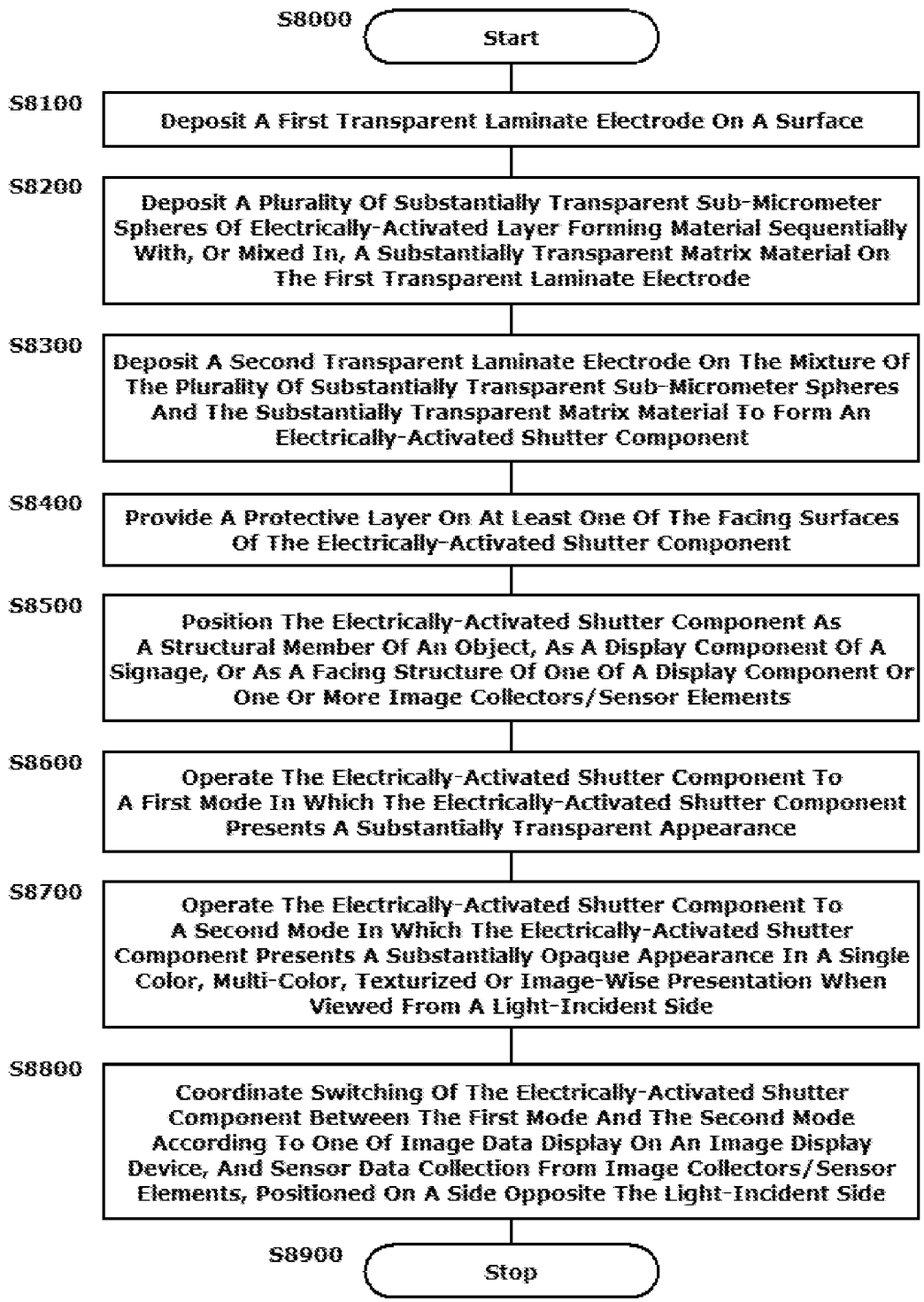
FIG. 8 illustrates a flowchart of an exemplary method for preparation and employment of an electrically-switchable energy filter or shutter component according to this disclosure.

The disclosed embodiments may include methods for preparation and employment of an electrically-switchable energy filter or shutter component. FIG. 8 illustrates a flowchart of such an exemplary method. As shown in FIG. 8, operation of the method commences at Step S8000 and proceeds to Step S8100.

In Step S8100, at least one first transparent laminate electrode may be deposited on a surface as a unitary structure or in discrete and independently energizable portions. Operation of the method proceeds to Step S8200.

In Step S8200, a plurality of substantially transparent micrometer or sub-micrometer spheres of electrically-activated layer forming material may be sequentially deposited with, or mixed in with, a substantially transparent matrix material on the first transparent laminate electrode as a substantially uniform mixture, or otherwise in discrete mixture sections Operation of the method proceeds to Step S8300.

In Step S8300, a second transparent laminate electrode may be deposited on the mixture of the plurality of substantially transparent micrometer or sub-micrometer spheres and the substantially transparent matrix material as a unitary structure in discrete and independently energizable portions to form an electrically-activated energy filter or shutter component. Operation of the method proceeds to Step S8400.

In Step S8400, the protective layer may be provided on at least one of the facing surfaces of the electrically-activated energy filter or shutter component. Operation of the method proceeds to Step S8500.

In Step S8500, the formed electrically-activated energy filter or shutter component may be positioned as a structural member of an object, as a display component of a signage, as a visually-changeable wall plate or as a facing structure of one of the display component or one or more image collectors/sensor elements. Operation of the method proceeds to Step S8600.

In Step S8600, the electrically-activated energy filter or shutter component may be operated according to a first mode in which the electrically-activated energy filter or shutter component presents a substantially transparent appearance across an entire surface or in discrete portions when viewed from an energy/light incident side. Operation the method proceeds to Step S8700.

In Step S8700, the electrically-activated energy filter or shutter component may be operated according to a second mode in which the electrically-activated energy filter or shutter component presents a substantially opaque appearance in a single color, multi-color, texturized or image-wise presentation across an entire surface or in discrete portions when viewed from an energy/light incident side. Operation of the method proceeds to Step S8800.

In Step S8800, switching of the electrically-activated energy filter or shutter component between the first mode and the second mode may be coordinated according to one of image data displayed on an image display device, and sensor data collection from image collectors/sensor elements positioned on a side opposite the energy/light incident side with respect to the electrically-activated energy filter or shutter component. Operation of the method proceeds to Step S8900, where operation of the method ceases.

The disclosed embodiments may include a non-transitory computer-readable medium storing instructions which, when executed by a processor, may cause the processor to execute all, or at least some, of the steps of the method outlined above, particularly with regard to the coordinated control of the electrically-activated shutter component.

Figure 9:
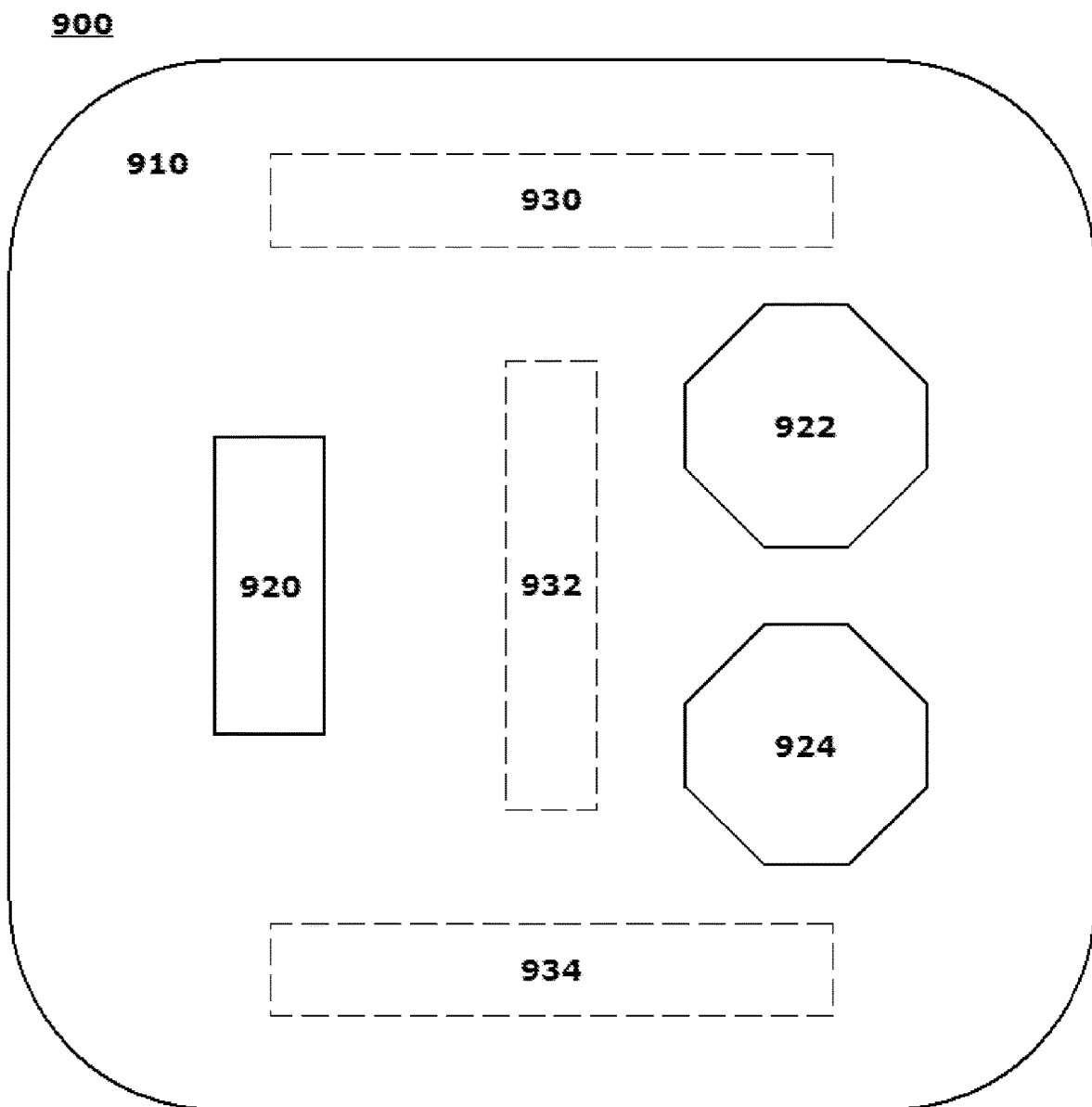
FIG. 9 illustrates a schematic diagram of an exemplary wall plate that incorporates at least discrete portions formed as electrically-activated energy filter layers and/or shutter components including switchable energy/light scattering layers according to this disclosure.

As is described in some detail above, the systems and methods according to this disclosure may be directed at forming common objects in a unique manner out of electrically-switchable substantially-transparent component materials to have particular energy/light scattering characteristics that cause the combination of substantially-transparent component materials to appear, for example, opaque when exposed to incident energy with wavelengths in the visual light spectrum, and as may be modified by applied electric fields. FIG. 9 illustrates a schematic diagram of an exemplary wall plate 900 that incorporates at least discrete portions formed of electrically-switchable energy filters or shutter components including energy/light scattering layers according to this disclosure. Such a wall plate 900 may be usable in a typical residential and/or commercial configuration having a wall plate surface 910 with openings 920, 922,924 to accommodate one or more of a mechanically-movable switch and/or receptacle components as may be typically found in an underlying gang box.

In embodiments, the wall plate surface 910 maybe an example of a solid object body structure formed entirely of an energy filter or shutter component including an energy/light scattering layer according to the above description. In separate embodiments, the wall plate surface 910 may be formed substantially of a conventional material in a specified color, while accommodating within its plan form certain discrete portions 930,932,934 formed of one or more energy filter or shutter components including energy/light scattering layers. In either construct, the energy filters or shutter components including energy/light scattering layers of the exemplary wall plate 900 may cover typical electrical switches, outlets and other residential and commercial installations. In embodiments, underlying switch boxes and/or outlet boxes may be configured to include energy- and/or light-activated sensors, devices, power generation components or the like. Provision of a wall plate 900 according to the disclosed embodiments may facilitate energy transmission through the wall plate 900, either entirely or in discrete portions while maintaining an opaque appearance, to the underlying sensors, devices or components. In embodiments, such underlying sensors, devices or components maybe affixed to the box side (non-light-incident side) of the wall plate 900, or may be otherwise affixed to one or more of the underlying components or to sides of the gang box itself. It should be appreciated that no particular limiting configuration of the disclosed wall plate 900 is intended to be implied by the exemplary depiction in FIG. 9.

In embodiments, the wall plate 900 may not be moded to switch back and forth between a transparent presentation and an opaque presentation, but rather maybe moded to switch between a first opaque presentation in a first (de-energized) mode of operation, and a second opaque presentation in a second (energized) mode of operation. For example, the wall plate 900 may have discrete portions that "light up" or otherwise display a particular message when energized.

The above-described exemplary systems and methods reference certain conventional components, sensors materials, and real-world use cases to provide a brief, general description of suitable operating, product processing, energy/light scattering layer component forming and electrically-activated shutter component operations by which the subject matter of this disclosure may be implemented for familiarity and ease of understanding. Although not required, embodiments of the disclosure may be provided, at least in part, in a form of hardware circuits, firmware, or software computer-executable instructions to control or carry out the specific energy/light scattering layer forming and electrically-activated energy filtering or shuttering functions described. These may include individual program modules executed by processors.

Those skilled in the art will appreciate that other embodiments of the disclosed subject matter may be practiced in many disparate film forming, layer forming, laminate layer forming, shutter component forming, wall plate forming, and/or shutter component operating systems and/or devices of many different configurations.

As indicated above, embodiments within the scope of this disclosure may include computer-readable media having stored computer-executable instructions or data structures that can be accessed, read and executed by one or more processors for controlling the disclosed energy filter or shutter component forming and shutter component operating schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, any molding or manufacturing technique including, for example, computer-aided design (CAD) or computer-aided manufacturing (CAM) of particular objects, object structures, layers, layer components and/or wall plates (as a particular example of a real-world use case).

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of executable instructions or associated data structures for carrying into effect those executable instructions represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 8, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

The invention claimed is:

1. A concealable sensor, comprising:
an electromagnetic energy filtering structure for concealing a sensor, comprising:
an energy scattering layer, comprising a plurality of substantially-transparent metallic particles and a substantially-transparent matrix material that fixes the particles in a layer arrangement to form the energy scattering layer, the energy scattering layer having an energy-incident surface and an opposite surface;
a power source that generates an electrical field;
refractive indices of at least some of the plurality of substantially-transparent metallic particles fixed in the substantially-transparent matrix material being modified between a first mode and a second mode when subjected to the electrical field, via plasmon resonance;
wherein portions of the energy scattering layer are configured to allow at least one first determined wavelength of electromagnetic energy to pass through the portion of the energy scattering layer subjected to effects from the generated electrical field, and to simultaneously cause at least one second determined wavelength of electromagnetic energy to be to be scattered; and
a sensor disposed so as to receive said at least one first wavelength of electromagnetic energy impinging on said energy-incident surface and passing therethrough, after said first wavelength of electromagnetic energy has passed through said energy-incident surface;
wherein said sensor is defined as being selected from the group consisting of a camera and a photovoltaic cell.

2. The concealable sensor of claim 1, wherein said electromagnetic energy filtering structure further comprises a plurality of transparent electrodes positioned adjacent to the other one of the energy-incident surface or the opposite surface of the energy scattering layer, the power source generating the electrical field between the transparent electrodes.

3. The concealable sensor of claim 2, the transparent electrodes positioned on one of an energy-incident surface or the opposite surface of the energy scattering layer being formed to have a plurality of discrete electrode portions for inducing a plurality of separate electrical fields acting on the energy scattering layer, discrete portions of the energy scattering layer exhibiting different responses in the second mode.

4. The concealable sensor of claim 1, a refractive index of at least a portion of the substantially-transparent matrix being modified by the generated electrical field between a first mode having a first refractive index and a second mode having a second refractive index.

5. The concealable sensor of claim 4, the first refractive index rendering the energy scattering layer transparent at least in discrete portions in the first mode.

6. The concealable sensor of claim 4,
the particles being fixed in the matrix material in a non-homogeneous structure of the energy scattering layer,
the particles being formed of at least two separate physical or material compositions;
the non-homogeneous structure in the energy scattering layer comprising particles of a first one of the two separate physical or material compositions being fixed in the matrix material in first discrete portions and particles of a second one of the two separate physical or material compositions being fixed in the matrix in second discrete portions; and
the first discrete portions and the second discrete portions exhibiting different second refractive indices in the second mode.

7. The concealable sensor of claim 4, the energy scattering layer in the second mode reflecting a same wavelength of incident light from the energy-incident surface in a manner that causes the energy-incident surface to appear as a single-color opaque surface.

8. The concealable sensor of claim 4, the energy scattering layer in the second mode reflecting a first wavelength of incident light from first discrete portions of the energy-incident surface and at least one second wavelength of the incident light from one or more second discrete portions of the energy-incident surface in a manner that causes the energy-incident surface to appear as at least one of a multi-color or texturized opaque surface.

* * * * *